(12) United States Patent
Yamazaki

(10) Patent No.: US 6,399,988 B1
(45) Date of Patent: Jun. 4, 2002

(54) THIN FILM TRANSISTOR HAVING LIGHTLY DOPED REGIONS

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/533,040

(22) Filed: Mar. 22, 2000

(30) Foreign Application Priority Data

Mar. 26, 1999 (JP) .......................................... 11-084997

(51) Int. Cl.[7] ............................................. H01L 21/331

(52) U.S. Cl. ........................ 257/344; 257/350; 257/72

(58) Field of Search ........................... 257/59, 72, 296, 257/344, 350, 392, 408

(56) References Cited

U.S. PATENT DOCUMENTS

| | | | |
|---|---|---|---|
| 5,247,190 A | | 9/1993 | Friend et al. |
| 5,399,502 A | | 3/1995 | Friend et al. |
| 5,508,209 A | | 4/1996 | Zhang et al. |
| 5,643,826 A | | 7/1997 | Ohtani et al. |
| 5,923,962 A | | 7/1999 | Ohtani et al. |
| 5,962,872 A | | 10/1999 | Zhang et al. |
| 6,140,162 A | * | 10/2000 | Yeo .............................. 438/155 |
| 6,163,055 A | * | 12/2000 | Hirakata et al. ............. 257/347 |
| 6,180,982 B1 | * | 1/2001 | Zhang et al. ................. 257/347 |
| 6,198,133 B1 | | 3/2001 | Yamazaki et al. |
| 6,259,120 B1 | | 7/2001 | Zhang et al. |

FOREIGN PATENT DOCUMENTS

| | | |
|---|---|---|
| JP | 7-130652 | 5/1995 |
| JP | 10-092576 | 4/1998 |
| WO | WO 90/13148 | 11/1990 |

OTHER PUBLICATIONS

Specification and Drawings for U.S. Patent application No. 09/599,185 filed on Apr. 27, 2000, "Semiconductor Device and Manufacturing Method Thereof", Shunpei Yamazaki.
Specification and Drawings for U.S. Patent application No. 09/528,113 filed Mar. 17, 2000, "Electro–Optical Device and Manufacturing Method Thereof", Shunpei Yamazaki.
Specification and Drawings for U.S. Patent application No. 09/544,801 filed Apr. 7, 2000, "Semiconductor Device and Method of Fabricating the Same", Shunpei Yamazaki et al.
Hatano et al., "A Novel Self–aligned Gate–overlapped LDD Poly–Si TFT with High Reliability and Performance", IEDM Technical Digest 97, pp. 523–526.
Hermann Schenk et al., "Polymers for Light Emitting Diodes", EuroDisplay '99 Proceedings, pp. 33–37.
Specification and Drawings for U.S. Patent application No. 09/559,185 filed on Apr. 27, 2000, "Semiconductor Device and Manufacturing Method Thereof", Shunpei Yamazaki.

* cited by examiner

Primary Examiner—David Nelms
Assistant Examiner—Bau T Le
(74) Attorney, Agent, or Firm—Eric J. Robinson; Nixon Peabody LLP

(57) ABSTRACT

By appropriately selecting the structure of top gate type or staggered type TFTs disposed in the respective circuits of a semiconductor device depending on the function of the circuits, the operating characteristics and the reliability of the semiconductor device is improved. An LDD region (107) the whole of which overlaps a gate electrode is provided in a first n-channel type TFT of a controlling circuit. LDD regions (111) and (112) at least part of which overlaps a gate electrode are provided in a second n-channel type TFT of the control circuit. LDD regions (117) to (120) which do not overlap a gate electrode through offset regions are provided in an n-channel type TFT of a pixel matrix circuit. By making different the concentration of LDD regions of the control circuit and the concentration of the pixel matrix circuit, optimized circuit operation is obtained.

52 Claims, 25 Drawing Sheets

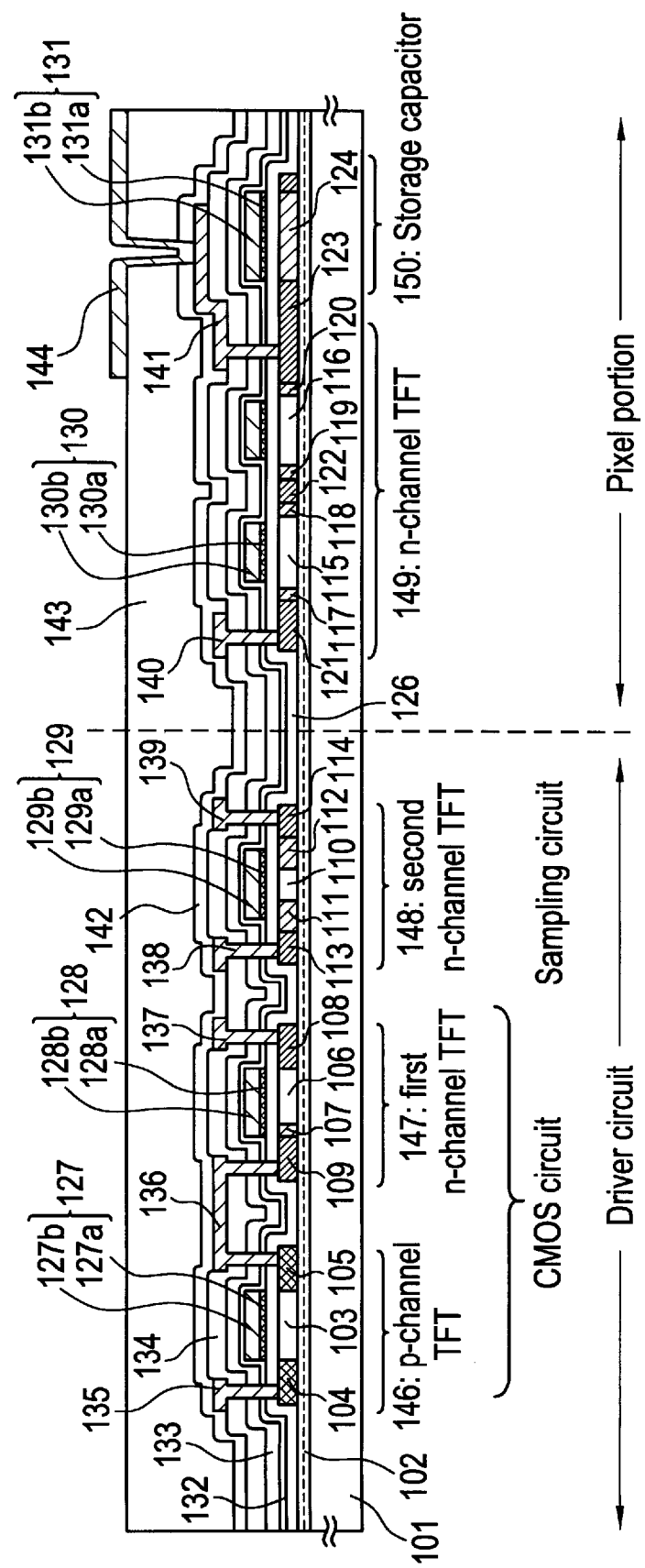

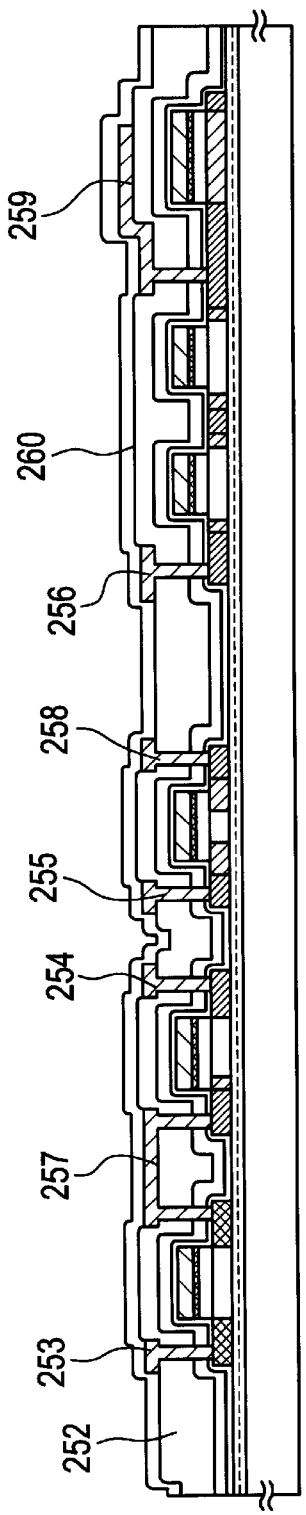
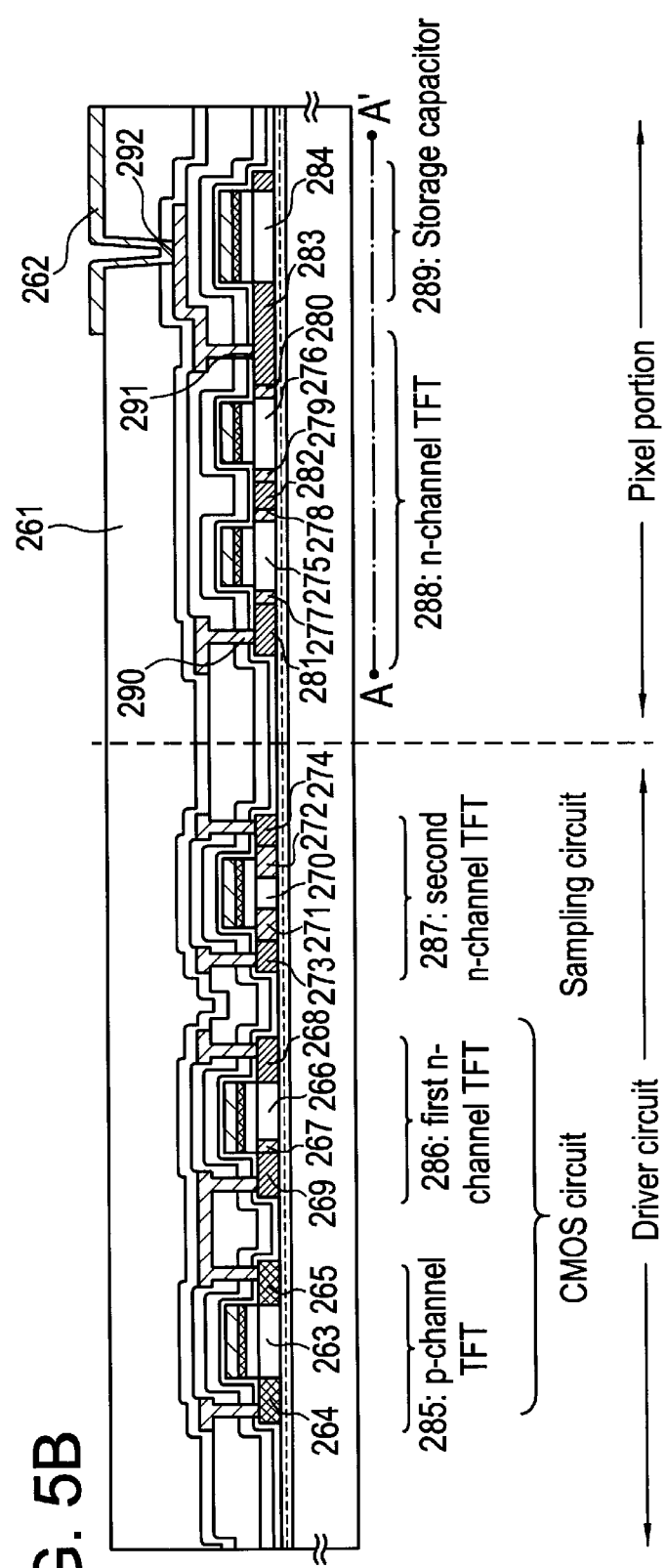
FIG. 5A
FIG. 5B

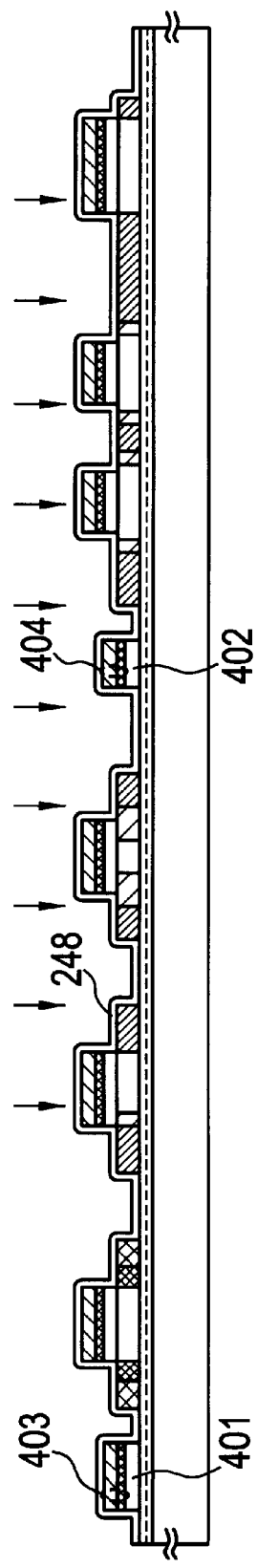
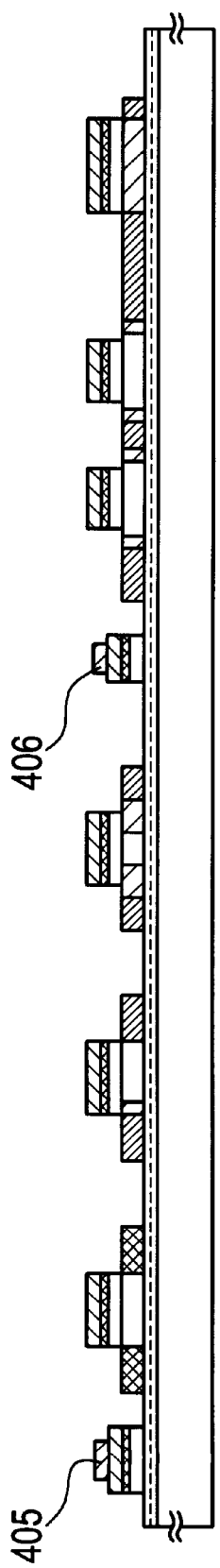

Loff = 1.5 um
Lov = 1.5 um
▲ Vd = 14(V)
△ Vd = 1(V)

W/L = 8/8

Loff = 0 um
Lov = 1.5 um
▲ Vd = 14(V)
△ Vd = 1(V)

W/L = 8/8

Lov = 2.5 um    W/L = 8/8
Vd = 14V

◆ SD (single drain)
◇ Loff = 0
▲ Loff = 1.5

Loff = 0 um
Vd = 14V

◆ Lov = 0.5 um   △ Lov = 2.0 um
◇ Lov = 1.0 um   ● Lov = 2.5 um
▲ Lov = 1.5 um

THIN FILM TRANSISTOR HAVING LIGHTLY DOPED REGIONS

BACKGROUND OF THE INVENTION

1. Field of the Invention

The present invention relates to a semiconductor device having a circuit formed of thin film transistors (hereinafter referred to as TFTs) over a substrate having an insulating surface, and to a method of manufacturing such a semiconductor device. In particular, the present invention is preferably utilized in an electro-optical device represented by a liquid crystal display device in which a pixel portion (or a pixel matrix circuit) and a driver circuit provided over the periphery of the pixel portion are provided over the same substrate, and in an electronic apparatus having such an electro-optical device mounted thereon. It is to be noted that a semiconductor device as used herein refers to any apparatus which functions by utilizing semiconductor characteristics, and includes the above-mentioned electro-optical device and electronic apparatus having such an electro-optical device mounted thereon.

2. Description of the Related Art

Semiconductor devices having a circuit formed of TFTs over a substrate having an insulating surface have been actively developed. An active matrix liquid crystal display device is well known as a representative example of such devices. Among such devices, since a TFT with a crystalline silicon film forming an active layer (hereinafter referred to as a crystalline silicon TFT) has a high field effect mobility and can form various function circuits, electro-optical devices with such crystalline silicon TFTs integrally formed over the same substrate have been developed.

For example, in an active matrix liquid crystal display device with an integral driver circuit is provided with a pixel portion for image display, a driver circuit for image display, and the like. The driver circuit is formed of a shift register circuit, a level shifter circuit, a buffer circuit, a sampling circuit, and the like formed based on a CMOS circuit. These circuits are all provided over the same substrate.

The operating conditions of the individual circuits are not necessarily the same, which follows that the characteristics required for the TFTs greatly vary. For example, the pixel portion is provided with pixel TFTs formed of n-channel type TFTs and a storage capacitance, and is driven by applying voltage to liquid crystal with the pixel TFTs being as switching elements. Since the liquid crystal is driven by alternating current, a method called as the frame inversion driving method is often adopted. In this method, the characteristic required for a pixel TFT is, in order to suppress the consumed power, to make the OFF current value (drain current passing when the TFT is OFF)sufficiently low. On the other hand, with regard to the buffer circuit of the driver circuit, since high driving voltage is applied to it, it is necessary to make its withstand voltage high in order to avoid its breakage even if high voltage is applied thereto. Further, in order to enhance the current driving capacity, it is necessary to sufficiently secure the ON current value (the drain current passing when the TFT is ON).

However, there is a problem in that the OFF current value of a crystalline silicon TFT is liable to be high. In addition, similarly to the case of a MOS transistor used in an IC or the like, deterioration such as decreasing in the ON current value and the like is observed in a crystalline silicon TFT. The main reason is hot carrier injection. Hot carrier generated due to the high electric field in the vicinity of the drain is thought to cause the deterioration.

As a TFT structure for decreasing the OFF current value, a lightly doped drain (LDD) structure is known. This is to provide a region where an impurity element is lightly doped, which is referred to as an LDD region, between a channel forming region and a source or drain region which is formed by heavily doping an impurity element.

As a means for preventing the deterioration due to the hot carrier, a so-called GOLD (gate-drain overlapped LDD) structure is known, where an LDD region is disposed so as to overlap a gate electrode through a gate insulating film. This structure alleviates the high electric field in the vicinity of the drain to prevent hot carrier injection, and thus, is effective in preventing the deterioration. For example, Mutuko Hatano, Hajime Akimoto, and Takeshi Sakai disclose on pp.523–526 in "IEDM97 TECHNICAL DIGEST 1997" a GOLD structure formed of side walls of silicon, and confirms that the reliability of the TFT is far superior to that of TFTs otherwise structured.

However, the required characteristics are not necessarily the same between a pixel TFT of the pixel portion and a TFT of the driver circuit such as the shift register circuit or the buffer circuit. For example, in a pixel TFT, a large reverse bias voltage (negative voltage in case of an n-channel type TFT) is applied to the gate electrode. On the other hand, a TFT of the driver circuit basically does not operate in a reversely biased condition. Further, the operating speed of a pixel TFT may be ⅟100 or less of that of a TFT of the driver circuit.

In addition, the GOLD structure has a problem in that, though it is highly effective in preventing the deterioration of the ON current value, the OFF current value is larger than that of an ordinary LDD structure. This follows that it is not preferable to apply the GOLD structure to a pixel TFT. On the other hand, an ordinary LDD structure is, though highly effective in suppressing the OFF current value, not effective in alleviating the electric field in the vicinity of the drain to prevent deterioration due to the hot carrier injection. As described above, in a semiconductor device having a plurality of integrated circuits with differing operating conditions such as an active matrix liquid crystal display device, it is not preferable to form all the TFTs as the same structure. This problem manifests itself clearly as the characteristics of crystalline silicon TFTs are improved and as higher performance of active matrix liquid crystal display devices is required.

SUMMARY OF THE INVENTION

Accordingly, the present invention is made to solve the above problem, and an object of the invention is to improve the operating characteristics and the reliability of a semiconductor device and to lower the consumed power by appropriately selecting the structure of TFTs disposed in the respective circuits of the semiconductor device depending on the function of the circuits.

As described above, according to the structure of the present invention, there is provided a semiconductor device comprising a pixel portion and a driver circuit of the pixel portion formed over the same substrate, characterized in that:

an LDD region of an n-channel type TFT of the pixel portion is disposed so as not to overlap a gate electrode of the n-channel type TFT of the pixel portion; an LDD region of a first n-channel type TFT of the driver circuit is disposed so as to overlap a gate electrode of the first n-channel type TFT;

an LDD region of a second n-channel type TFT of the driver circuit is disposed so as to at least partly overlap a gate electrode of the second n-channel type TFT; and an offset region is formed between a channel forming region of the n-channel type TFT of the pixel portion and the LDD region of the n-channel type TFT of the pixel portion.

Also, according to another structure of the present invention, there is provided a semiconductor device comprising a pixel portion and a driver circuit of the pixel portion formed over the same substrate, characterized in that:

the driver circuit comprises a first n-channel type TFT provided such that the whole LDD region overlaps a gate electrode and a second n-channel type TFT provided such that part of an LDD region overlaps a gate electrode;

an LDD region of an n-channel type TFT forming the pixel portion is provided such that the whole of the LDD region does not overlap a gate electrode at all; and an offset region is formed between a channel forming region of the n-channel type TFT of the pixel portion and the LDD region of the n-channel type TFT of the pixel portion.

According to the structure of the present invention, it is characterized in that an impurity element imparting n-type is contained in the LDD regions of the first n-channel type TFT and of the second n-channel type TFT of the driver circuit at a concentration larger than that contained in the LDD region of the n-channel type TFT of the pixel portion, the concentration ratio is preferable set to two to ten times as large as that contained in the LDD region of the n-channel type TFT of the pixel portion. Specifically, it is preferable that an impurity element imparting n-type is contained in the LDD regions of the first n-channel type TFT and of the second n-channel type TFT of the driver circuit at the concentration ranging of from $2\times10^{16}$ to $5\times10^{19}$ atoms/cm$^3$ and an impurity element imparting n-type is contained in the LDD region of the n-channel type TFT of the pixel portion at the concentration ranging of from $1\times10^{16}$ to $5\times10^{18}$ atoms/cm$^3$.

According to the structure of the present invention, it is characterized in that the offset region is formed of a semiconductor film having the same composition as that of the channel forming region abutting against the offset region, an impurity element imparting p-type may be contained in the offset region at the concentration ranging of from $1\times10^{15}$ to $1\times10^{18}$ atoms/cm$^3$.

According to the structure of the present invention, a storage capacitance may be formed from a semiconductor layer connected with the n-channel type TFT of the pixel portion and containing an impurity element imparting n-type, capacitance wirings, and an insulating film between the semiconductor layer and the capacitance wirings in the pixel portion.

According to the present invention, there is provided a method of manufacturing a semiconductor device comprising a pixel portion and a driver circuit of the pixel portion formed over the same substrate, the method being characterized by comprising:

a first step of selectively doping an impurity element imparting n-type at the concentration ranging of from $2\times10^{16}$ to $5\times10^{19}$ atoms/cm$^3$ in active layers of first and second n-channel type TFTs forming the driver circuit;

a second step of selectively doping an impurity element imparting p-type at the concentration ranging of from $3\times10^{20}$ to $3\times10^{21}$ atoms/cm$^3$ in an active layer of a p-channel type TFT forming the driver circuit;

a third step of selectively doping an impurity element imparting n-type at the concentration ranging of from $1\times10^{20}$ to $1\times10^{21}$ atoms/cm$^3$ in the active layers of the first and second n-channel type TFTs forming the driver circuit and in an active layer of an n-channel type TFT of the pixel portion; and a fourth step of selectively doping an impurity element imparting n-type at the concentration ranging of from $1\times10^{16}$ to $5\times10^{18}$ atoms/cm$^3$ in the active layer of the n-channel type TFT of the pixel portion through an insulating film covering at least the side surfaces of a gate electrode of the n-channel type TFT.

Also, according to the present invention, there is provided a method of manufacturing a semiconductor device comprising a pixel portion and a driver circuit of the pixel portion formed over the same substrate, the method being characterized by comprising:

a first step of selectively doping an impurity element imparting n-type at the concentration ranging of from $2\times10^{16}$ to $5\times10^{19}$ atoms/cm$^3$ in active layers of first and second n-channel type TFTs forming the driver circuit and in a semiconductor layer forming a storage capacitance of the pixel portion;

a second step of selectively doping an impurity element imparting n-type at the concentration ranging of from $1\times10^{16}$ to $5\times10^{18}$ atoms/cm$^3$ in an active layer of an n-channel type TFT of the pixel portion through an insulating film covering at least the side surfaces of a gate electrode of the n-channel type TFT;

a third step of selectively doping an impurity element imparting p-type at the concentration ranging of from $3\times10^{20}$ to $3\times10^{21}$ atoms/cm$^3$ in an active layer of a p-channel type TFT forming the driver circuit; and a fourth step of selectively doping an impurity element imparting n-type at the concentration ranging of from $1\times10^{20}$ to $1\times10^{21}$ atoms/cm$^3$ in the active layers of the first and second n-channel type TFTs forming the driver circuit and in the active layer of the n-channel type TFT of the pixel portion, in the first step, an impurity element can be simultaneously doped at the same concentration as that of the semiconductor layers forming the storage capacitance of the pixel portion. Further, it is characterized in that by the second step, an n-type impurity region and an offset region sandwiched between the n-type impurity region and a channel forming region are formed in the n-channel type TFT of the pixel portion.

According to the present invention, there is provided a method of manufacturing a semiconductor device, it is characterized in that the offset region is formed in a self-aligning manner with the insulating film covering the gate electrode of the n-channel type TFT being as the mask, the thickness of the insulating film is preferably 20 to 100 nm.

FIGS. 11A to 11C are views for explaining the structure of the present invention, and explains the positional relationship between a gate electrode and an LDD region in a TFT comprising a channel forming region and the LDD region of an active layer, a gate insulating film on the active layer, and the gate electrode on the gate insulating film.

In FIG. 11A, a structure is shown provided with an active layer having a channel forming region 501, an LDD region 502, and a drain region 503, and a gate insulating film 504 and a gate electrode 505 on the active layer. The LDD region 502 is provided so as to overlap the gate electrode 505 through the gate insulating film 504. Such an LDD region is herein referred to as $L_{ov}$. $L_{ov}$ has the action to alleviate the high electric field generated in the vicinity of the drain, can prevent the deterioration due to the hot carrier, and thus, is suitable for use in an n-channel type TFT of the shift register circuit, the level shifter circuit, the buffer circuit, and the like of the driver circuit.

In FIG. 11B, a structure is shown provided with an active layer having the channel forming region 501, LDD regions 506 and 507, and a drain region 508, and the gate insulating film 504 and the gate electrode 505 on the active layer. The LDD region 506 is provided so as to overlap the gate electrode 505 through the gate insulating film 504. The LDD region 507 is provided so as not to overlap the gate electrode 505. Such an LDD region is herein referred to as $L_{off}$. $L_{off}$ has the action to decrease the OFF current value. The structure provided with $L_{ov}$ and $L_{off}$ can prevent the deterioration due to the hot carrier and, at the same time, can decrease the OFF current value. This is suitable for use in an n-channel type TFT of the sampling circuit of the driver circuit.

In FIG. 11C, a structure is shown where an active layer is provided with the channel forming region 501, an offset region 509, an LDD region 510, and a drain region 511. The LDD region 510 is provided so as not to overlap the gate electrode 505 and is off the gate electrode 505 by the width of the offset region 509. The composition of the offset region 509 is the same as that of the channel forming region 501. By forming the offset region and providing $L_{off}$ in this way, the OFF current value can be effectively decreased, and thus, this is suitable for use in an n-channel type TFT of the pixel portion. The concentration of the impurity element imparting n-type in the LDD region 510 of the pixel portion is preferably ½ to 1/10 of that in the LD regions 502, 506, and 507 of the driver circuit.

BRIEF DESCRIPTION OF THE DRAWINGS

In the accompanying drawings in which:

FIG. 1 is a sectional view of a pixel portion and a driver circuit of an embodiment of the present invention;

FIGS. 5A and 5B are sectional views illustrating the manufacturing process of the pixel portion and the driver circuit;

FIGS. 13A to 13C are sectional views illustrating the manufacturing process of a pixel portion and a driver circuit;

DETAILED DESCRIPTION OF THE PREFERRED EMBODIMENTS

Figure 2A:
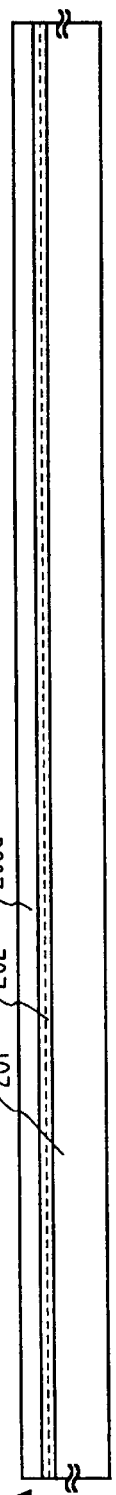
FIGS. 2A to 2E are sectional views illustrating the manufacturing process of a pixel portion and a driver circuit.

An embodiment of the present invention is now described with reference to FIG. 1. FIG. 1 illustrates a structure in section of TFTs of a pixel portion and of a driver circuit provided on the periphery of the pixel portion all formed over the same substrate.

A substrate 101 has an insulating surface. Other than an insulating substrate such as a glass substrate or a quartz substrate, a metal substrate having an insulating film formed thereon, a silicon substrate, or a ceramic substrate may be used as the substrate 101. If the substrate 101 is a glass substrate, a low alkali glass substrate represented by, for example, the #1737 substrate of Corning, is preferable. It is more preferable if a base film 102 containing as the main component silicon oxide or silicon nitride is closely formed on the surface of the substrate. An n-channel type TFT 149 and a storage capacitance 150 of the pixel portion, a first n-channel type TFT 147, a p-channel type TFT 146, and a second n-channel type TFT 148 of the driver circuit are formed over the substrate 101.

The active layers of these TFTs are formed using crystalline semiconductor films, and are patterned to be islandlike. The crystalline semiconductor films are, most preferably, crystalline silicon films formed from an amorphous silicon film by known laser crystallization technique, thermal crystallization technique, or crystallization technique using a catalytic element facilitating the crystallization of the amorphous silicon. Of course, other semiconductor materials may also be used. The active layers are formed at the thickness of from 20 to 150 nm, preferably 30 to 75 nm.

In the active layer of the p-channel type TFT 146 of the driver circuit, a channel forming region 103, a source region 104, and a drain region 105 are formed. In the active layer of the first n-channel type TFT 147, a channel forming region 106, a source region 108, a drain region 109, and an LDD region 107 are formed. An impurity element imparting n-type is contained in the LDD region 107 at the concentration ranging of from $2\times10^{16}$ to $5\times10^{19}$ atoms/cm$^3$. The impurity element imparting n-type may be any known one in the field of the semiconductor technology, and typically, may be phosphorus (P) or arsenic (As). The LDD region 107 is an $L_{ov}$ region provided so as to overlap a gate electrode 128 through a gate insulating film 126, and is provided only on the side of the drain region. Of course the $L_{ov}$ region may be provided on the side of the source region. Using the p-channel type TFT 146 and the n-channel type TFT 147, a shift register circuit, a level shifter circuit, a buffer circuit, and the like can be formed.

In the active layer of the second n-channel type TFT 148 of the driver circuit, a channel forming region 110, a source region 113, a drain region 114, and LDD regions 111 and 112 are formed. The LDD regions 111 and 112 are formed of $L_{ov}$ and $L_{off}$. The n-channel type TFT 148 is preferably used for a sampling circuit and the like.

Figure 11A:
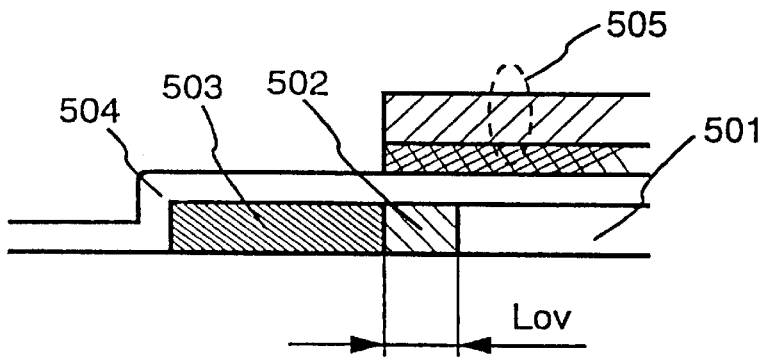
FIGS. 11A to 11C explain the positional relationship between a gate electrode and an LDD region.
Figure 11B:
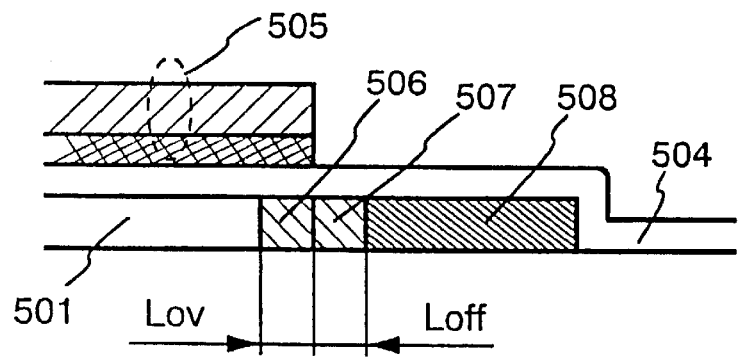
Figure 11C:
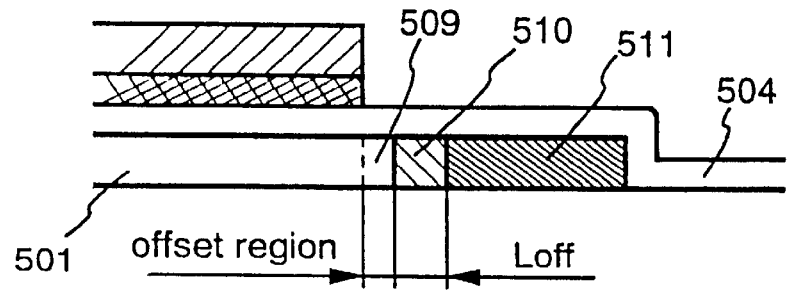

In the active layer of the n-channel type TFT 149 of the pixel portion, channel forming regions 115 and 116, source or drain regions 121 to 123, and LDD regions 117 to 120 are provided. The LDD regions are, as shown in FIG. 11C, provided so as not to overlap a gate electrode with the help of offset regions. The concentration of an impurity element imparting n-type contained in the LDD regions is in the range of from $1 \times 10^{16}$ to $5 \times 10^{18}$ atoms/cm$^3$, and is preferably ½ to ⅒ of that in the LDD regions of the n-channel type TFTs of the driver circuit.

The LDD regions of the n-channel type TFTs of the driver circuit are provided mainly for the purpose of alleviating the high electric field in the vicinity of the drains to prevent the deterioration of the ON current value due to the hot carrier injection. On the other hand, the LDD regions of the n-channel type TFTs of the pixel portion are provided mainly for the purpose of decreasing the OFF current value, and thus, the above ranges of the concentration are determined.

The length of the $L_{ov}$ regions of the n-channel type TFTs of the driver circuit in the direction of the channel length is 0.5 to 3.0 µm, preferably 1.0 to 1.5 µm while the channel length is 3 to 8 µm. The length of the $L_{off}$ regions is 0.3 to 2.0 µm, preferably 0.5 to 1.5 µm. The length of the $L_{off}$ regions of the n-channel type TFT of the pixel portion in the direction of the channel length is 0.5 to 3.5 µm, typically 1.5 to 2.5 µm. The length of the offset regions is 0.02 to 0.1 µm.

The gate insulating film 126 is formed of silicon nitride film, silicon oxide film, or silicon oxynitride film (for example, a film formed by plasma CVD with SiH$_4$, N$_2$O, NH$_3$, or the like being as the material). The thickness of the gate insulating film 126 is 20 to 200 nm, preferably 70 to 150 nm. Gate electrodes 127 to 130 are formed of a material containing one or more elements selected from titanium (Ti), tantalum (Ta), chromium (Cr), molybdenum (Mo), tungsten (W), nickel (Ni), and copper (Cu). For example, the gate electrodes may be twotolayer structure consisting of tantalum nitride (TaN) and Ta in this order from the side of the gate insulating film.

A capping layer 132 at the thickness of from 20 to 100 nm is formed so as to cover the gate electrodes and the gate insulating film. The capping layer 132 may be of any material as far as it is an insulating film, and may be formed of, for example, silicon oxide film or silicon nitride film. A first interlayer insulating film consists of a protective insulating film 133 and an interlayer insulating film 134 closely formed thereon, and may be formed in a laminated structure of silicon nitride film, silicon oxide film, silicon oxynitride film, or a combination thereof. For example, the protective insulating film 133 may be of silicon oxynitride film and the interlayer insulating film 134 may be of silicon oxide film. The thickness of the first interlayer insulating film is 500 to 1500 nm in total.

In the first interlayer insulating film, contact holes reaching the source or drain regions of the respective TFTs are formed, and source wirings 135, 137, 138, and 140 and drain wirings 136, 139, and 141 are provided. Although not shown, the wirings may be three-layer laminated structure formed of a Ti film at the thickness of 200 nm, an Al film containing Ti at the thickness of 450 nm, and another Ti film at the thickness of 150 nm.

A passivation film 142 is formed of silicon nitride, silicon oxide film, or silicon oxynitride film at the thickness of from 30 to 500 nm, typically 50 to 200 nm. Further, a second interlayer insulating film 143 is formed at the thickness of from 1000 to 2000 nm. The second interlayer insulating film may be formed using an organic resin film such as polyimide, polyamide, acrylic resin, polyimideamide, benzocyclobutene, or the like. The advantages of using an organic resin film are that the film can be formed relatively easily, that the parasitic capacitance can be lowered by the low specific dielectric constant, that the flatness is satisfactory, and the like. For example, when polyimide of a thermal polymerization type after being applied is used, the film can be formed at about 300° C. It is to be noted that organic resin films other than the above-mentioned, organic silicon oxide compounds, and the like may also be used.

At the pixel portion, a contact hole reaching the drain wirings 141 is formed in the second interlayer insulating film 143 and the passivation film 142, and a pixel electrode 144 is provided. In providing the pixel electrode, if the display device to be produced is a transmission type, a transparent conductive film is used, while, if the display device to be produced is a reflection type, a metal film is used. Preferable materials for the transparent conductive film are indium oxide (In$_2$O$_3$), tin oxide (SnO$_2$), zinc oxide (ZnO), and the like, and typically, the film is formed using indium tin oxide (ITO).

An active matrix substrate having the pixel portion and the driver circuit of the pixel portion over the same substrate and structured as above is formed. In the driver circuit, the first n-channel type TFT 147, the p-channel type TFT 146, and the second n-channel type TFT 148 are formed, and it is also possible to form a logic circuit based on a CMOS circuit. In the pixel portion, the n-channel type TFT 149 is formed, and in addition, the storage capacitance 150 is formed of capacitance wirings 131 which are formed simultaneously with the gate electrodes, an insulating film formed of the same material as that of the gate insulating film, and a semiconductor layer 124 with an impurity element imparting n-type doped therein for connecting with the source or drain region 123 of the n-channel type TFT 149.

As described above, the present invention can make it possible to optimize the structure of the TFTs forming the respective circuits depending on the required specification of the pixel portion and the driver circuit to improve the operating performance and the reliability of the semiconductor device. More specifically, by making different the design of the LDD regions of the n-channel type TFTs depending on the specification of the respective circuits and by appropriately providing $L_{ov}$ or $L_{off}$ regions, both a TFT structure which attaches greater importance to measures against hot carrier and a TFT structure which attaches greater importance to decreasing the OFF current value can be materialized over the same substrate.

EMBODIMENT 1

An embodiment of the present invention is described with reference to FIGS. 2A to 5B. Here, a method of simultaneously forming TFTs of the pixel portion and of the driver circuit provided on the periphery of the pixel portion is described in the order of the manufacturing processes. It is to be noted that, for the sake of simplicity, with regard to the driver circuit, only a CMOS circuit which is a basic circuit of a shift register circuit, a buffer circuit, and the like, and an n-channel type TFT forming a sampling circuit are shown in the figures.

In FIG. 2A, it is preferable that a low alkali glass substrate or a quartz substrate is used as a substrate 201. In the present embodiment, a low alkali glass substrate is used as the substrate 201. In this case, the glass substrate may be thermally treated in advance at a temperature lower than the glass distortion point by 10 to 20° C. On the surface of the substrate 201 where the TFTs are to be formed, for the purpose of preventing impurity diffusion from the substrate 201, a base film 202 of silicon oxide film, silicon nitride film, silicon oxynitride film, or the like is formed. For example, a silicon oxynitride film formed from $SiH_4$, $NH_3$, and $N_2O$ may be formed by plasma CVD at the thickness of 100 nm, and a silicon oxynitride film formed from $SiH_4$ and $N_2O$ may be formed similarly at the thickness of 200 nm to form lamination.

Next, a semiconductor film 203 having the amorphous structure is formed in a known manner such as by plasma CVD, sputtering at the thickness of from 20 to 150 nm (preferably 30 to 80 nm). In the present embodiment, an amorphous silicon film is formed by plasma CVD at the thickness of 55 nm. Such semiconductor films having the amorphous structure includes amorphous semiconductor films, microcrystalline semiconductor films, and the like, and a compound semiconductor film having the amorphous structure such as an amorphous silicon germanium film may also be used. Further, since the base film 202 and an amorphous silicon film 203a can be formed using the same film forming method, the two may be continuously formed. By not exposing the substrate to the atmosphere after the base film is formed thereon, contamination of the surface can be prevented, and thus, variation in the characteristics of the TFTs to be formed thereon and variation in the threshold voltage can be decreased (FIG. 2A).

Figure 2B:
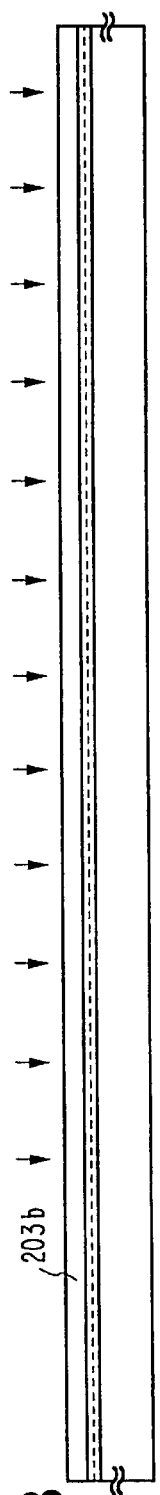

Then, using known crystallization technique, a crystalline silicon film 203b is formed from the amorphous silicon film 203a. For example, laser crystallization or thermal crystallization (solid phase growth) may be used. Here, according to the technique disclosed in Japanese Patent Application Laid-Open No. Hei 7-130652, with crystallization using a catalytic element, the crystalline silicon film 203b is formed. Prior to the crystallization process, it is preferable to, depending on the amount of hydrogen contained in the amorphous silicon film, carry out heat treatment at 400 to 500° C. for about an hour to make the amount of hydrogen contained to be 5 atomic % or less. Since the atoms are rearranged to be denser when the amorphous silicon film is crystallized, the thickness of the crystalline silicon film to be formed is smaller than that of the original amorphous silicon film (55 nm in the present embodiment) by 1 to 15% (FIG. 2B).

Figure 2C:
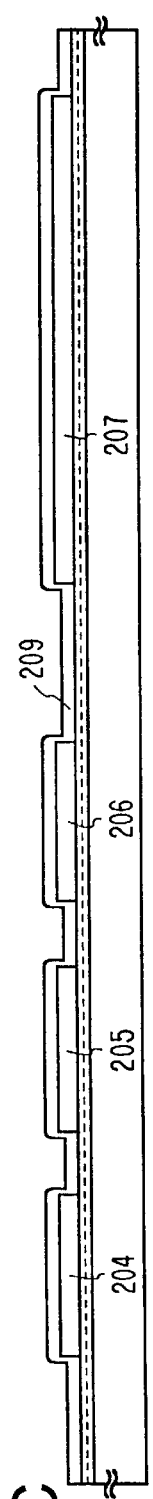

Then, the crystalline silicon film 203b is patterned to be island-like to form island-like semiconductor layers 204 to 207. After that, a mask layer 208 is formed of silicon oxide film by plasma CVD or sputtering at the thickness of from 50 to 100 nm (FIG. 2C).

Next, a resist mask 209 is provided, and, for the purpose of controlling the threshold voltage, boron (B) is doped all over the surface of island-like semiconductor layers 210 to 212 for forming n-channel type TFTs as an impurity element imparting p-type at the concentration of from about $1 \times 10^{16}$ to $5 \times 10^{17}$ atoms/cm$^3$. Boron (B) may be doped by ion doping, or, alternatively, may be doped simultaneously with the formation of the amorphous silicon film. Though the boron (B) doping is indispensable, in order to make the threshold voltage of the n-channel type TFTs in a predetermined range, it is preferable to carry out the boron doping (FIG. 2D).

For the purpose of forming the LDD regions of the n-channel type TFTs of the driver circuit, an impurity element imparting n-type is selectively doped in the island-like semiconductor layers 210 and 211, which requires the formation of resist masks 213 to 216 in advance. As the impurity element imparting n-type, phosphorus (P) or arsenic (As) may be used. Here, ion doping with phosphine ($PH_3$) is used to dope phosphorus (P). The concentration of phosphorus (P) in formed impurity regions 217 and 218 is in the range of from $2 \times 10^{16}$ to $5 \times 10^{19}$ atoms/cm$^3$. The concentration of the impurity element imparting n-type contained in impurity regions 217 to 219 formed here is herein referred to as (n$^-$). An impurity region 219 is a semiconductor layer for forming the storage capacitance of the pixel portion. Phosphorus (P) at the same concentration is also doped in this region (FIG. 2E).

Figure 2D:
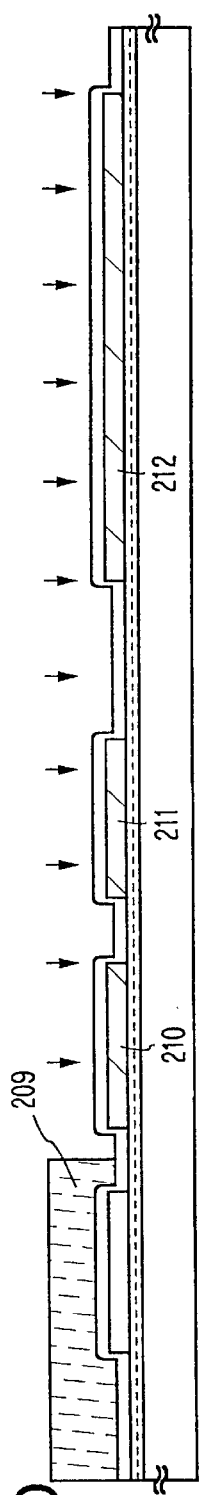
Figure 2E:
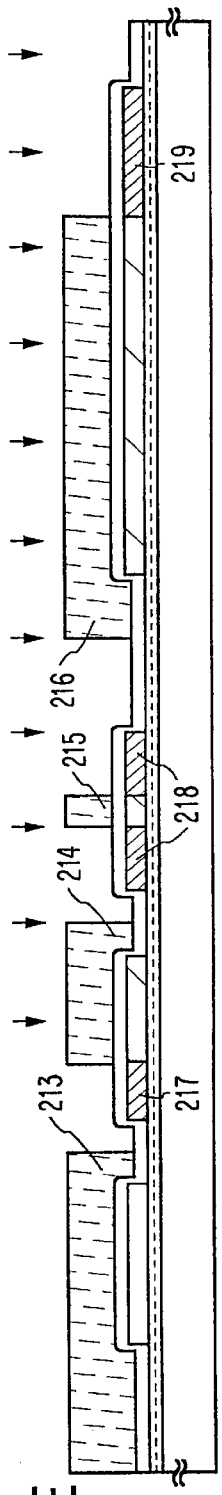

Next, the mask layer 208 is removed with fluoric acid or the like and an activation process for the impurity elements doped in FIGS. 2D and 2E is carried out. The activation can be carried out by heat treatment in a nitrogen atmosphere at 500 to 600° C. for 1 to 4 hours or laser activation, or, the two may be used jointly. In the present embodiment, laser activation is adopted and KrF excimer laser light (wavelength: 248 nm) is used to form linear beams having the oscillating frequency of from 5 to 50 Hz and the energy density of from 100 to 500 mJ/cm$^2$ which scans with the overlapping ratio of from 80 to 98% to treat the whole surface of the substrate having the island-like semiconductor layers formed thereon. It is to be noted that there is no limitation on the conditions of the laser light irradiation, and the conditions may be appropriately decided by the operator.

Figure 3A:
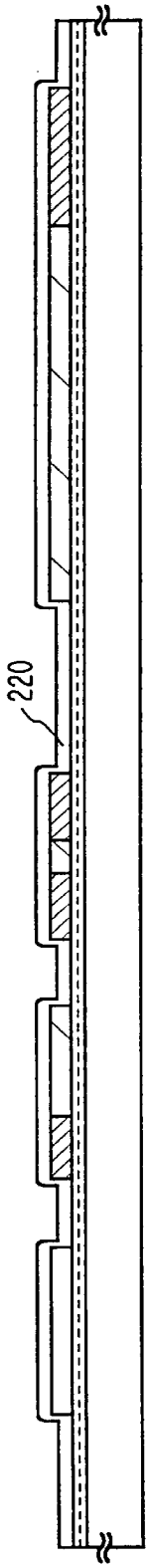
FIGS. 3A to 3D are sectional views illustrating the manufacturing process of the pixel portion and the driver circuit.

Then, a gate insulating film 220 is formed from an insulating film containing silicon by plasma CVD or sputtering at the thickness of from 10 to 150 nm. For example, a silicon oxynitride film at the thickness of 120 nm is formed. A single layer or lamination of other insulating films containing silicon may also be used as the gate insulating film (FIG. 3A).

Next, a conductive film to be gate electrodes and gate wirings is formed. Though the conductive film may be a single-layer conductive film, it is preferable to form the conductive film as the laminated structure of, for example, two or three layers, depending on the situation. In the present embodiment, a laminated film consisting of a first conductive film 221 and a second conductive film 222 is formed. As the first and second conductive films 221 and 222, a conductive film formed of or mainly formed of an element selected from Ta, Ti, Mo, W, and Cr (typically tantalum nitride film, tungsten nitride film, or titanium nitride film), or a film of alloy which is a combination of the above elements (typically Mo-W alloy film or Mo-Ta alloy film), or a silicide film of any of the above elements (typically tungsten silicide film or titanium silicide film) can be used.

Figure 3B:
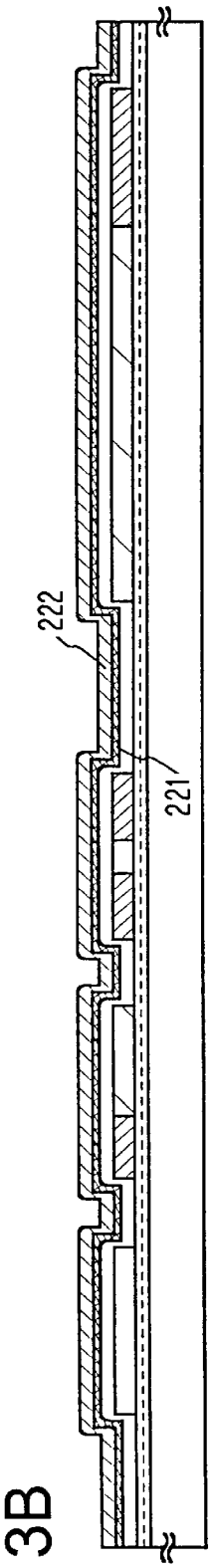

The thickness of the first conductive film 221 is 10 to 50 nm (preferably 20 to 30 nm) while that of the second conductive film 222 is 200 to 400 nm (preferably 250 to 350 nm). In the present embodiment, a tantalum nitride film at the thickness of 30 nm is used as the first conductive film while a Ta film at the thickness of 350 nm is used as the second conductive film, both of which are formed by sputtering. When sputtering is used to form the films, by adding an appropriate amount of Xe or Kr to Ar as the sputtering gas, the internal stress of the film to be formed can be alleviated to prevent the film from peeling off. It is to be noted that, though not shown, it is effective to form a silicon film at the thickness of from 2 to 20 nm under the first conductive film 221. This improves the adherence of the conductive film to be formed thereon and oxidation can be prevented (FIG. 3B).

Figure 3C:
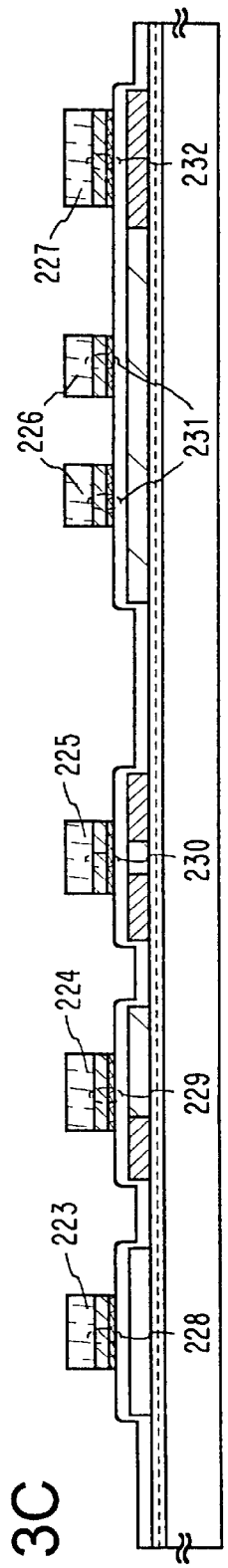

Then, resist masks 223 to 227 are formed and the first and second conductive films 221 and 222 are etched together to form gate electrodes 228 to 231, gate wirings (wirings connected with gate electrodes), and capacitance wirings 232. Here, gate electrodes 234 and 235 formed in the driver circuit are formed so as to overlap part of the impurity regions 217 and 218 through the gate insulating film 220. The overlapping portions will be $L_{ov}$ regions later (FIG. 3C).

Figure 3D:
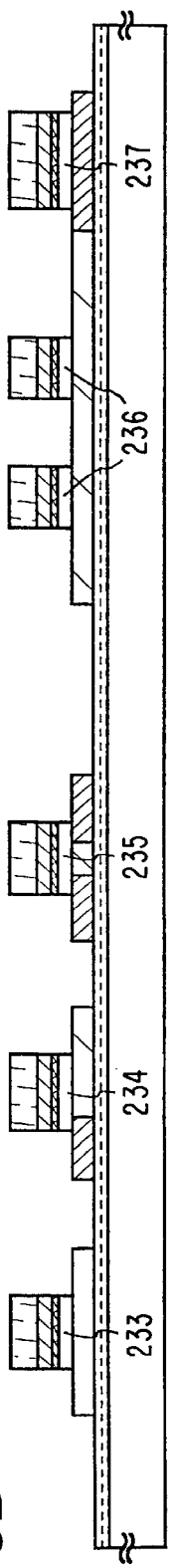

With the gate electrodes and the capacitance wirings being as the mask, the gate insulating film 220 is etched to expose part of the island-like semiconductor layers such that gate insulating films 233 to 236 remain at least under the gate electrodes (here, an insulating film 237 is also formed under the capacitance wirings). This step is carried out for the purpose of efficiently doping an impurity element later in a process of doping the impurity element for forming source or drain regions, but this step may be omitted and the gate insulating film may remain on the whole surface of the island-like semiconductor layers (FIG. 3D).

Figure 4A:
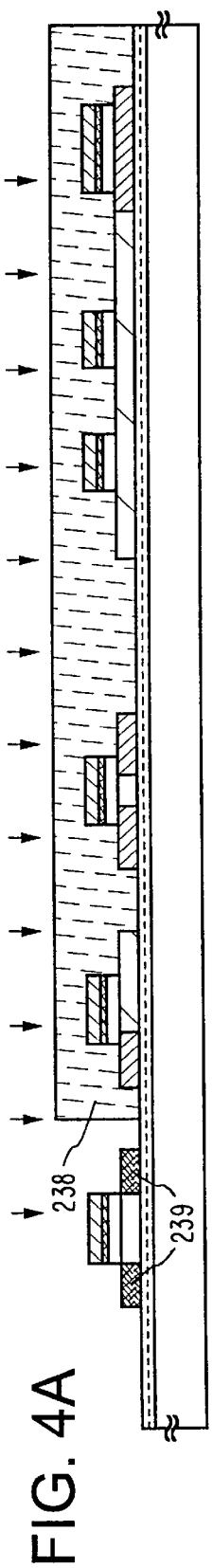
FIGS. 4A to 4D are sectional views illustrating the manufacturing process of the pixel portion and the driver circuit.

Then, for the purpose of forming the source and drain regions of the p-channel type TFT of the driver circuit, a step of doping an impurity element imparting p-type is carried out. Here, with the gate electrode 228 being as the mask, the impurity region is formed in a self-aligning manner. Here, the regions where the n-channel type TFTs are to be formed are covered with a resist mask 238. Impurity regions 239 are formed by ion doping using diborane ($B_2H_6$). The concentration of boron in these regions is $3\times10^{20}$ to $3\times10^{21}$ atoms/cm$^3$. The concentration of the impurity element imparting p-type contained in the impurity regions 239 formed here is herein referred to as (p$^+$) (FIG. 4A).

Figure 4B:
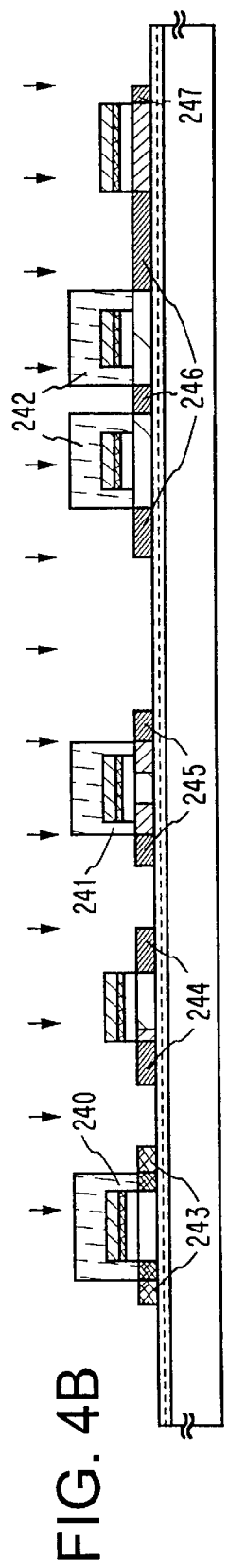

Next, in the n-channel type TFTs, impurity regions to function as source or drain regions are formed. Resist masks 240 to 242 are formed so as to cover the regions to be the gate electrode and the p-channel type TFT, and an impurity element imparting n-type is doped to form impurity regions 243 to 247. This is done by ion doping using phosphine ($PH_3$) with the concentration of phosphorus (P) in these regions being $1\times10^{20}$ to $1\times10^{21}$ atoms/cm$^3$. The concentration of the impurity element imparting n-type contained in the impurity regions 243 to 247 formed here is herein referred to as (n$^+$) (FIG. 4B).

The impurity regions 243 to 247 already contain phosphorus (P) or boron (B) doped in previous steps, but since phosphorus (P) is doped at a sufficiently larger concentration, the influence of phosphorus (P) or boron (B) doped in the previous steps can be neglected. Further, since the concentration of phosphorus (P) doped in the impurity regions 243 is ½ to ⅓ of that of boron (B) doped in FIG. 4A, the conductivity of p-type is secured without influence on the TFT characteristics.

Figure 4C:
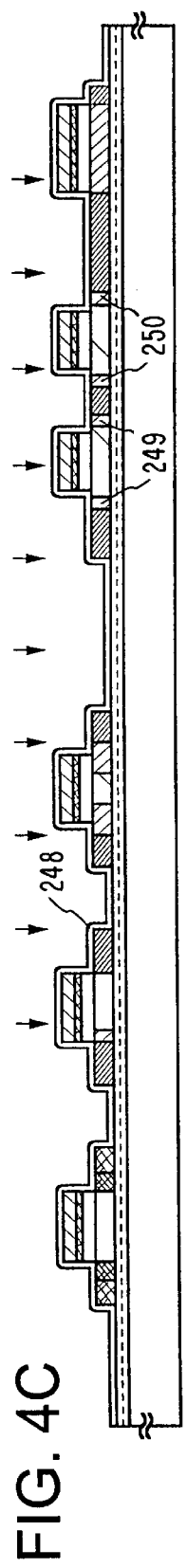

Then, the resist masks are removed, and a capping layer 248 is formed at the thickness of from 25 to 200 nm so as to cover at least the side surfaces of the gate electrodes 228 to 231 and the gate insulating films 233 to 236. The capping layer is formed of silicon nitride film, silicon oxynitride film, or the like. In the present embodiment, a silicon oxynitride film is formed by plasma CVD at the thickness of 100 nm. Then, for the purpose of forming the LDD regions of the n-channel type TFT of the pixel portion, a step of doping impurity element imparting n-type is carried out. Here, an impurity element imparting n-type is doped by ion doping through the capping layer 248 into the island-like semiconductor layers thereunder. Here, the concentration of the doped phosphorus (P) is $1\times10^{16}$ to $5\times10^{18}$ atoms/cm$^3$. By carrying out the doping with the concentration lower than that of the impurity elements doped in FIGS. 2E, 4A, and 4B, only impurity regions 249 and 250 are formed. The concentration of the impurity element imparting n-type contained in the impurity regions 249 and 250 formed here is herein referred to as (n$^-$) (FIG. 4C).

Here, the impurity regions 249 and 250 are formed outside the gate electrodes by the thickness of the capping layer formed on the side surfaces of the gate electrodes and the gate insulating films, that is, offset regions are formed. In the offset regions, no impurity element is doped by ion doping, and the composition of the offset regions is the same as that of the channel forming regions. By appropriately selecting the film thickness of the capping layer, the length of the offset regions can be controlled.

Then, a protective insulating film 251 to be part of a first interlayer insulating film later is formed. The protective insulating film 251 is formed of silicon nitride film, silicon oxide film, silicon oxynitride film, or lamination film of a combination thereof. The film thickness is 100 to 400 nm.

After that, a heat treatment process is carried out to activate the impurity elements imparting n or p-type doped at the respective concentrations. The process can be carried out by furnace annealing, laser annealing, or rapid thermal annealing (RTA). Here, the activation process is carried out by furnace annealing. Heating is carried out in a nitrogen atmosphere at 300 to 650° C., preferably 500 to 550° C., here 525° C. for four hours. Then, heat treatment is carried out in an atmosphere containing 3 to 100% of hydrogen at 300 to 450° C. for 1 to 12 hours to hydrogenate the island-like semiconductor layers. This process is a process where the dangling bonds in the active layers are terminated by thermally excited hydrogen. As means other than the hydrogenation, plasma hydrogenation (hydrogen excited by plasma is used) may be carried out.

Figure 4D:
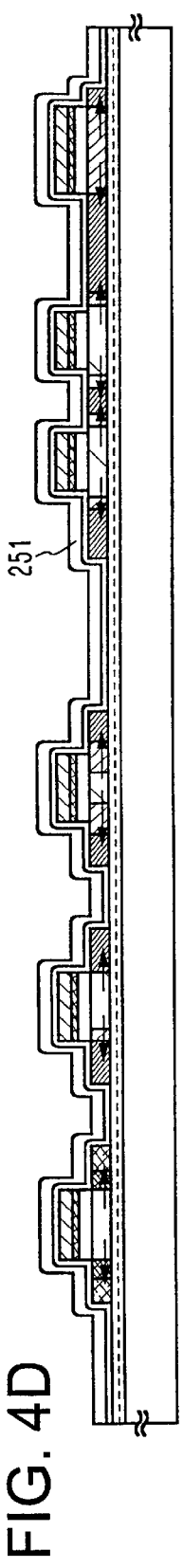

In case the island-like semiconductor layers are formed from an amorphous silicon film by crystallization using a catalytic element, a small amount of the catalytic element remains in the island-like semiconductor layers. Of course, it is still possible to complete a TFT in such a condition, but it is more preferable to remove the remaining catalytic element at least from the channel forming region. To utilize the gettering action by phosphorus (P) is a means for removing the catalytic element. The concentration of phosphorus (P) necessary for the gettering is about the same as that in the impurity region (n$^+$) formed in FIG. 4B. By the heat treatment in the activation process carried out here, the catalytic element can be gettered from the channel forming regions of the n-channel type TFTs and the p-channel type TFT (FIG. 4D).

After the activation process, an interlayer insulating film 252 is formed on the protective insulating film 251 at the thickness of from 500 to 1500 nm. The laminated film consisting of the protective insulating film 251 and the interlayer insulating film 252 is a first interlayer insulating film. After that, contact holes reaching the source regions or the drain regions of the respective TFTs are formed, and source wirings 253 to 256 and drain wirings 257 to 259 are formed. Although not shown, in the present embodiment, the wirings is three-layer laminated structure formed of a Ti film at the thickness of 100 nm, an Al film containing Ti at the thickness of 300 nm, and another Ti film at the thickness of 150 nm, all formed continuously by sputtering.

Then, as a passivation film 260, a silicon nitride film, a silicon oxide film, or a silicon oxynitride film is formed at the thickness of from 50 to 500 nm (typically 100 to 300 nm). Hydrogenation treatment carried out in this condition resulted in sufficient improvement in the TFT characteristics. For example, heat treatment in an atmosphere containing 3 to 100% of hydrogen at 300 to 450° C. for 1 to 12 hours is preferable. Alternatively, use of plasma hydrogenation resulted in similar effects. It is to be noted that, here, an opening may be formed in the passivation film 260 at a position where a contact hole for connecting a pixel electrode and the drain wirings is to be formed later (FIG. 5A).

After that, a second interlayer insulating film 261 of an organic resin is formed at the thickness of from 1.0 to 1.5 μm. As the organic resin, polyimide, acrylic resin, polyamide, polyimideamide, BCB (benzocyclobutene), or the like can be used. Here, polyimide of a thermal polymerization type after being applied to the substrate is used, and the film is formed by carrying out baking at 300° C. A contact hole reaching the drain wirings 259 is formed in the second interlayer insulating film 261, and a pixel electrode 262 is formed. In forming the pixel electrode 262, if the liquid crystal display device to be produced is a transmission type, a transparent conductive film is used, while, if the liquid crystal display device to be produced is a reflection type, a metal film is used. In the present embodiment, in order to make a transmission type liquid crystal display device, an indium tin oxide (ITO) film is formed by sputtering at the thickness of 100 nm (FIG. 5B).

In this way, an active matrix substrate having the pixel portion and the driver circuit over the same substrate is completed. In the driver circuit, a p-channel type TFT 285, a first n-channel type TFT 286, and a second n-channel type TFT 287 are formed. In the pixel portion, a pixel TFT formed of an n-channel type TFT 288 is formed.

The p-channel type TFT 285 of the driver circuit has a channel forming region 263, a source region 264, and a drain region 265. The first n-channel type TFT 286 has a channel forming region 266, an $L_{ov}$ region 267, a source region 268, and a drain region 269. The length of the $L_{ov}$ region in the direction of the channel length is 0.5 to 3.0 μm, preferably 1.0 to 1.5 μm. The second n-channel type TFT 287 has a channel forming region 270, LDD regions 271 and 272, a source region 273, and a drain region 274. The LDD regions can be divided into an $L_{ov}$ region and an $L_{off}$ region. The length of the $L_{off}$ region in the direction of the channel length is 0.3 to 2.0 μm, preferably 0.5 to 1.5 μm. The n-channel type TFT 288 of the pixel portion has channel forming regions 275 and 276, and $L_{off}$ regions 277 to 280. The length of the $L_{off}$ regions in the direction of the channel length is 0.5 to 3.0 μm, preferably 1.5 to 2.5 μm. The $L_{off}$ regions are formed so as to be offset with respect to the gate electrode, and the length of the offset regions is 0.02 to 0.2 μm. Further, a storage capacitance 289 is formed of the capacitance wirings 232 which is formed simultaneously with the gate electrodes, an insulating film formed of the same material as that of the gate insulating film, and a semiconductor layer 284 with an impurity element imparting n-type doped therein for connecting with the drain region 283 of the n-channel type TFT 288. In FIG. 5B, the n-channel type TFT 287 of the pixel portion has the double gate structure, but it may have the single gate structure, or the multi gate structure provided with a plurality of gate electrodes.

EMBODIMENT 2

Figure 6A:
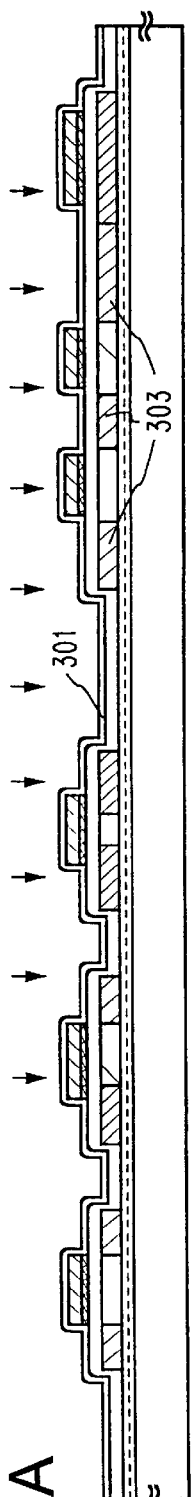
FIGS. 6A and 6B are sectional views illustrating the manufacturing process of the pixel portion and the driver circuit.
Figure 6B:
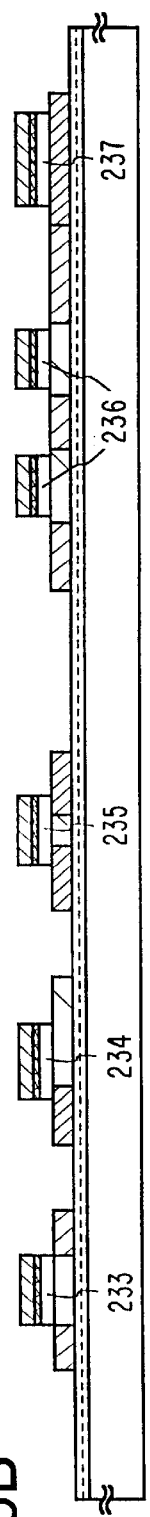

The present embodiment is described with reference to FIGS. 6A and 6B, and a method of simultaneously forming TFTs of the pixel portion and of the driver circuit provided on the periphery of the pixel portion differently from that in Embodiment 1 is described.

First, similarly to the case of Embodiment 1, the steps shown in FIGS. 2A to 3C are carried out. Then, a capping layer 301 is formed so as to cover at least the side surfaces of the gate electrodes 228 to 231. The capping layer is of a silicon nitride film, a silicon oxynitride film, or the like, and is formed at the thickness of from 25 to 200 nm. In the present embodiment, a silicon oxynitride film is formed by plasma CVD at the thickness of 100 nm. Then, an impurity element imparting n-type is doped by ion doping through the capping layer 301 into the island-like semiconductor layers thereunder to form impurity regions 303 to be LDD regions of the n-channel type TFT of the pixel portion. Here, the concentration of the doped phosphorus (P) is $1 \times 10^{16}$ to $5 \times 10^{18}$ atoms/cm$^3$ (FIG. 6A).

With the gate electrodes and the capacitance wirings being as the mask, the gate insulating film 220 is etched to expose part of the island-like semiconductor layers such that the gate insulating films 233 to 236 remain at least under the gate electrodes (here, the insulating film 237 is also formed under the capacitance wirings). This step is carried out for the purpose of efficiently carrying out a later process of doping the impurity element in source or drain regions, but this step may be omitted and the gate insulating film may remain on the whole surface of the island-like semiconductor layers (FIG. 6B).

The steps after this are carried out similarly to those in Embodiment 1 (except the step shown in FIG. 4C), and an active matrix substrate shown in FIG. 5B can be formed.

EMBODIMENT 3

Figure 13C:
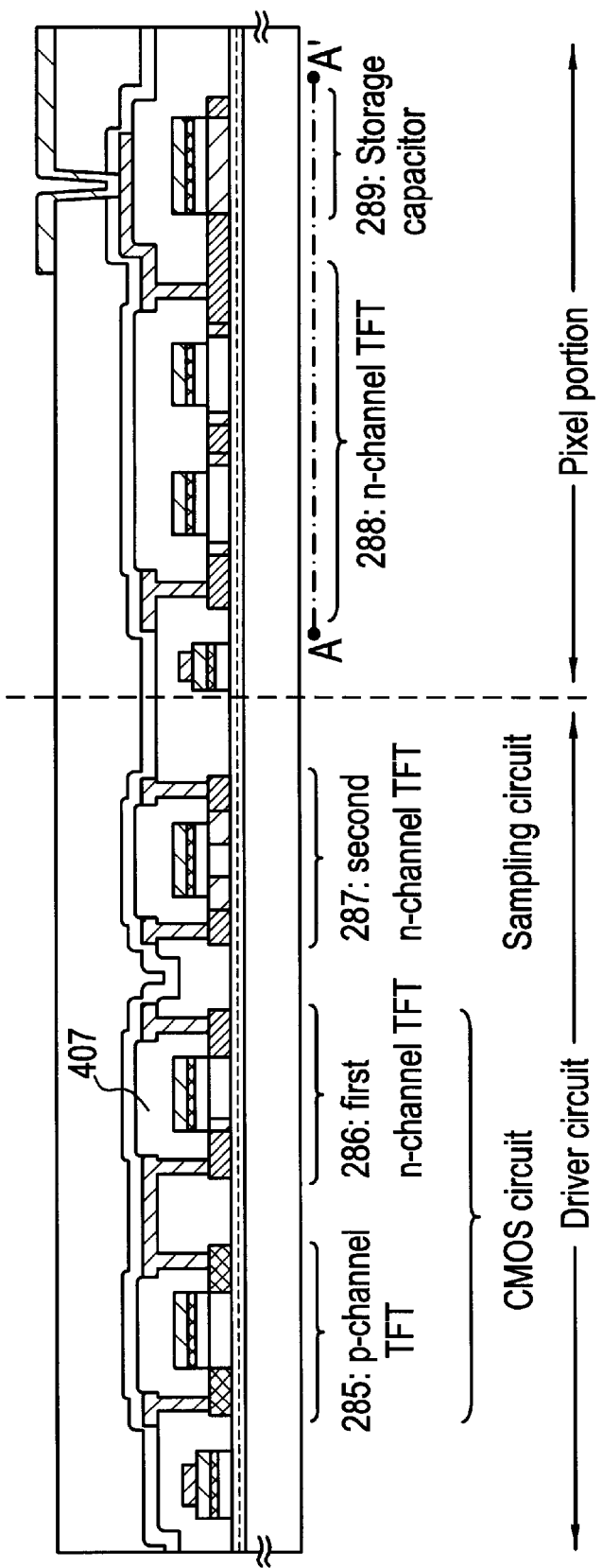

The present embodiment is described with reference to FIGS. 13A to 13C, and another method of simultaneously forming TFTs of the pixel portion and of the driver circuit provided on the periphery of the pixel portion is described.

First, similarly to the case of Embodiment 1, the steps shown in FIGS. 2A to 4B are carried out. Here, in FIG. 13A, first wirings 403 and 404 are simultaneously formed from the same material as that of the gate electrodes. Insulating films 401 and 402 are formed from the same material as that of the gate insulating film 220. Then, the capping layer 248 is formed so as to cover at least the side surfaces of the gate electrodes. The capping layer is of silicon nitride film, silicon oxynitride film, or the like, and is formed at the thickness of 25 to 200 nm. In the present embodiment, a silicon oxynitride film is formed by plasma CVD at the thickness of 100 nm. Then, an impurity element imparting n-type is doped by ion doping through the capping layer 248 into the island-like semiconductor layers thereunder to form impurity regions to be LDD regions of the n-channel type TFT of the pixel portion. Here, the concentration of the doped phosphorus (P) is $1 \times 10^{16}$ to $5 \times 10^{18}$ atoms/cm$^3$ (FIG. 13A).

After that, the capping layer 248 is etched and removed with fluoric acid or the like. Then, as shown in FIG. 13B, second wirings 405 and 406 formed of a conductive film of aluminum (Al), copper (Cu), or the like are patterned on the wirings 403 and 404, and then, a first interlayer insulating film 407 of a silicon nitride film, a silicon oxide film, a silicon oxynitride film, or the like is formed. The steps after this are carried out similarly to those in Embodiment 1. Source or drain wirings, a passivation film, a second interlayer insulating film, and a pixel electrode are formed, and an active matrix substrate shown in FIG. 13C is completed.

The first and second wirings 403 and 405 are integrally formed, and the first and second wirings 404 and 406 are integrally formed, respectively, and are provided as part of wirings from an input/output terminal to an input/output terminal of each circuit and part of gate wirings of the pixel portion. By providing the second wirings 405 and 406 using a low resistance material such as Al or Cu, the wiring resistance can be decreased, and thus, a large sized direct-view type display device (the 20 inch class or larger) can be accommodated.

EMBODIMENT 4

Figure 7:
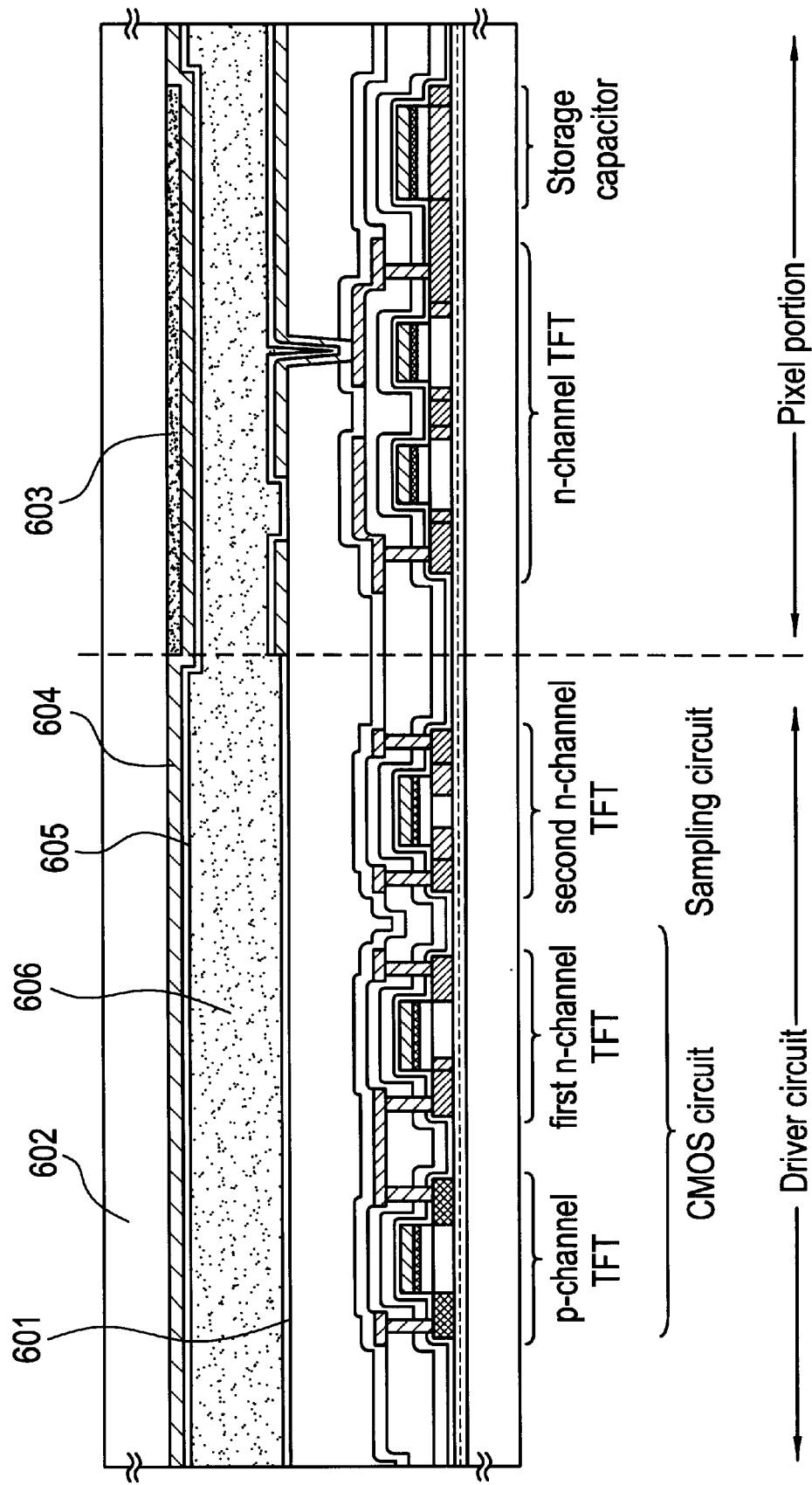
FIG. 7 is a sectional structural view of an active matrix liquid crystal display device.

In the present embodiment, processes of manufacturing an active matrix liquid crystal display device from an active matrix substrate is described. As shown in FIG. 7, an alignment film 601 is formed onto the state of active matrix substrate of FIG. 5B fabricated in Embodiment 1. A polyimide resin is generally used for an alignment film of liquid crystal display devices. A shielding film 603, a transparent conductive film 604 and an alignment film 605 are formed on the opposing substrate 602 on the opposite side. After forming the alignment film, rubbing treatment is performed so that liquid crystal molecules are aligned at a determined pre-tilt angle. The active matrix substrate on which pixel section and CMOS circuits are formed, and the opposing substrate are such together through a sealing material and spacers etc. (neither is shown) by a known cell assembly process. Thereafter liquid crystal material 606 is injected between both substrates and completely sealed by a sealant (not shown). A publicly known liquid crystal material may be used for the liquid crystal material. An active matrix liquid crystal display device shown in FIG. 7 is thus completed.

Figure 8:
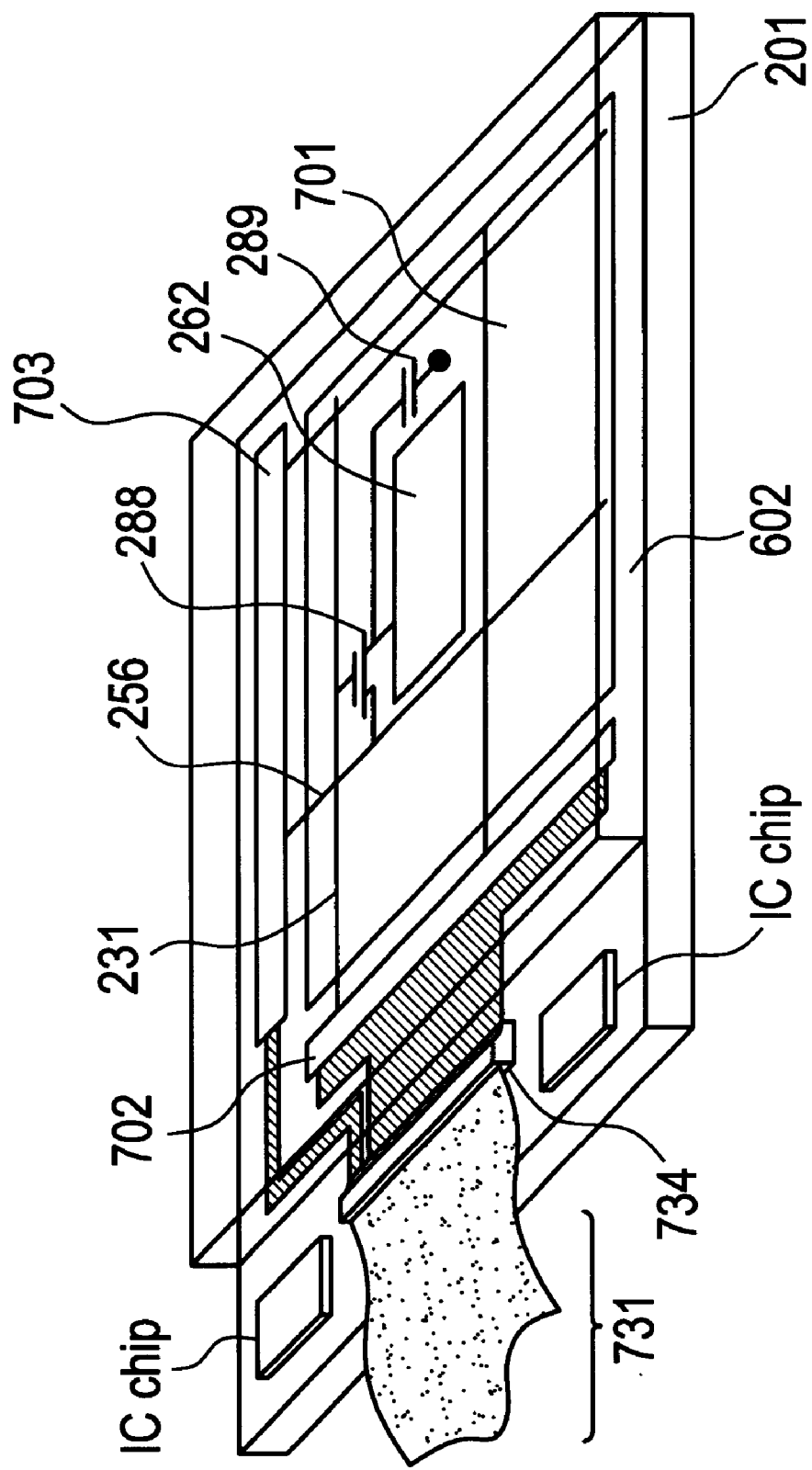
FIG. 8 is a perspective view of the active matrix liquid crystal display device.
Figure 9:
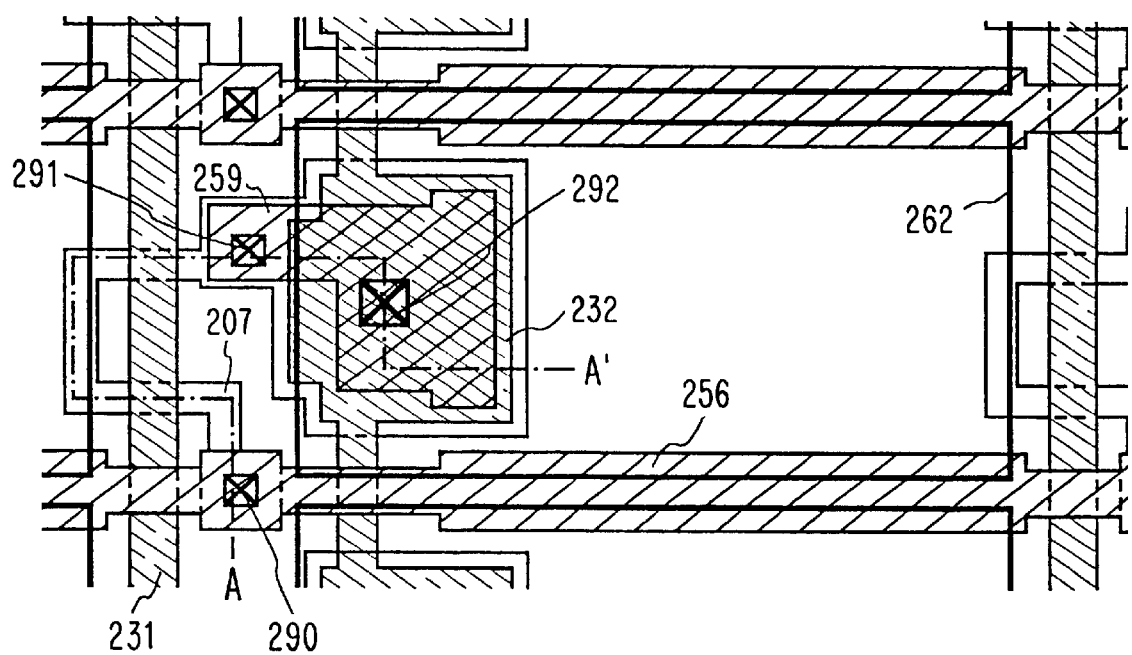
FIG. 9 is a plan view of the pixel portion.

The structure of this active matrix liquid crystal display device is next explained by referring to perspective view of FIG. 8 and top view of FIG. 9. FIGS. 8 and 9 use the common reference numerals in order to correspond to the cross sectional structures of FIGS. 2 to 5 and 7. Note that the cross sectional view at A–A' shown in FIG. 9 corresponds to the cross sectional view of pixel section shown in FIG. 5B.

The active matrix substrate comprises pixel section 701, scanning signal driver circuit 702 and image signal driver circuit 703 formed on the glass substrate 201. An n-channel TFT 288 is disposed in the pixel section and driver circuit provided in its peripheral basically comprises a CMOS circuit. Scanning signal driver circuit 702 and image signal driver circuit 703 are connected to the n-channel TFT 288 of the pixel section through gate wiring 231 (note that it is shown by applying the same reference numeral as the gate electrode to mean it is formed to be connected and extended from the gate electrode) and source wiring 256, respectively. Further, FPC 731 is connected to external input-output terminal 734.

FIG. 9 is a top view which shows a part (corresponding to approximately 1 pixel) of pixel section 701. Gate wiring 231 intersects an active layer under a gate insulating film not shown in the figure, by interposing the gate insulating film. Though not shown, a source region, a drain region and an $L_{off}$ region formed from n⁻ region are formed in the active layer. Reference numeral 290 is a contact section of the source wiring 256 and the source region 281, and reference numeral 292 is a contact section of the drain wiring 259 and the pixel electrode 262. Storage capacitor 289 is formed in a section where a semiconductor layer 284 extended from a drain region of n-channel TFT 288 and capacitance wiring 232 overlap by interposing a gate insulating film.

Note that while the active matrix liquid crystal display device of the present embodiment has been described by referring to the structure explained in Embodiment 1, the active matrix liquid crystal display device can be manufactured by freely combining with any structure of Embodiment 1 to 3.

EMBODIMENT 5

Figure 10:
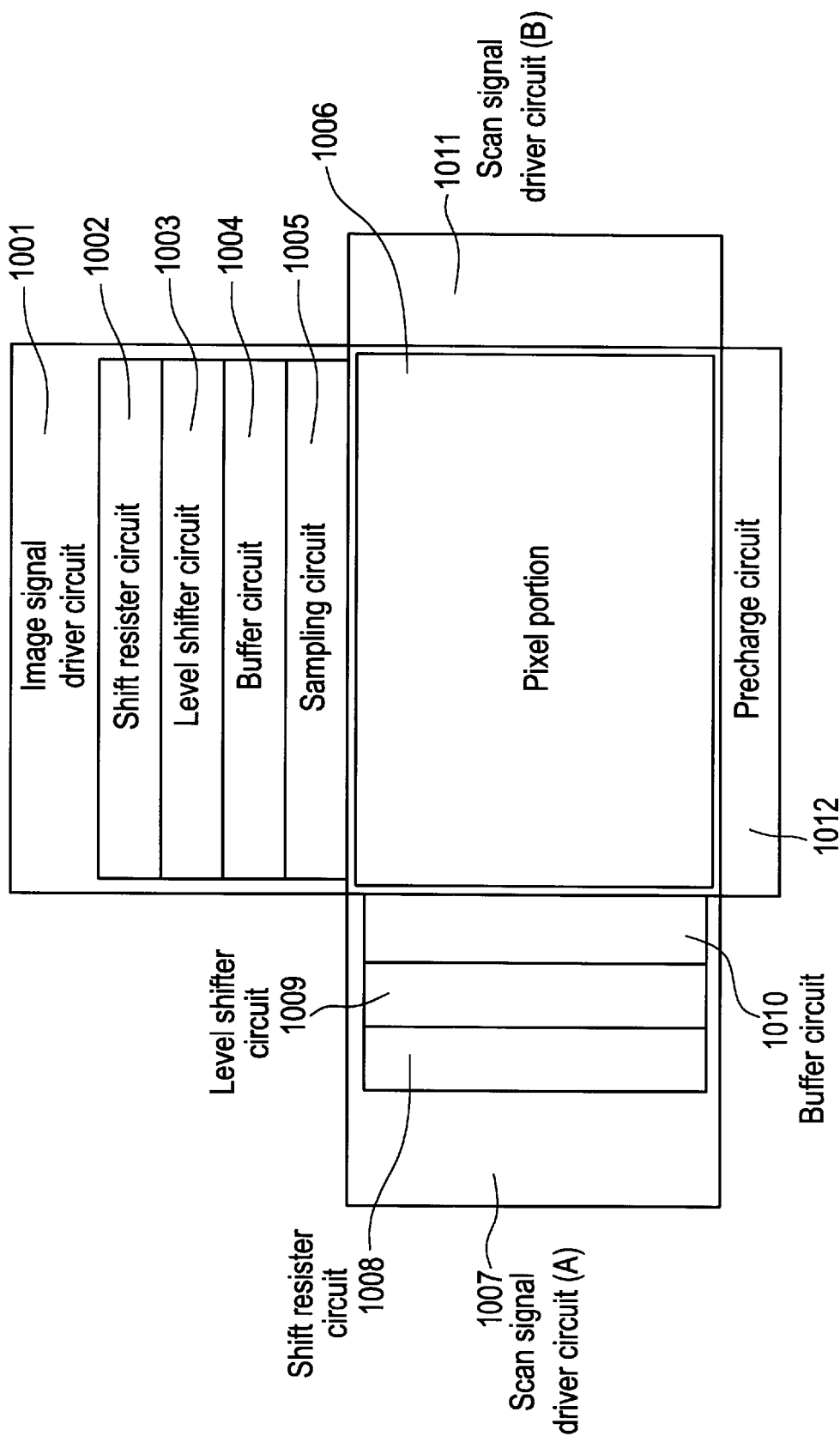
FIG. 10 is a circuit diagram of the active matrix liquid crystal display device.

FIG. 10 shows an example of circuit structure of an active matrix substrate described in Embodiments 1 to 3, and is a diagram showing a circuit structure of direct-view type display device. The active matrix substrate of the present embodiment comprises an image signal driver circuit 1001, a scanning signal driver circuit (A) 1007, a scanning signal driver circuit (B) 1011, a precharge circuit 1012, a pixel section 1006. Note that a driver circuit designated in the present specification is a generitic term including an image signal driver circuit 1001 and scanning signal driver circuit (A) 1007.

An image signal driver circuit 1001 comprises a shift register circuit 1002, a level shifter circuit 1003, a buffer circuit 1004 and a sampling circuit 1005. A scanning signal driver circuit (A) 1007 comprises a shift register circuit 1008, a level shifter circuit 1009 and a buffer circuit 1010. The scanning signal driver circuit (B) 1011 also has a similar structure.

The driver voltage for shift register circuits 1002 and 1008 is 5 to 16V (typically 10V), and the structure shown by reference numeral 286 of FIG. 5B is suitable for an n-channel TFT of a CMOS circuit which comprises these circuits.

Though the driver voltage of level shifter circuits 1003 and 1009 and buffer circuits 1004 and 1010 is as high as 14 to 16V, CMOS circuit comprising an n-channel TFT 286 of FIG. 5B is suited similar to the shift register circuits. When the gate is formed by a multi-gate structure in these circuits, the resistance to voltage is increased and it is effective in improving the reliability of the circuits.

Because the polarity of the driver voltage is inverted one after the other when driving, and because it is required to reduce OFF current value, a CMOS circuit comprising an n-channel TFT 287 of FIG. 5B is suited for a sampling circuit 1005 though the driver voltage is 14 to 16V. Though only n-channel TFT is shown in FIG. 5B for the sampling circuit, p-channel TFT is combined in the actual sampling circuit. It is sufficient if the p-channel TFT here has a structure shown by 285 of FIG. 5B.

The driver voltage for the pixel section 1006 is 14 to 16V, and further reduction of OFF current value than sampling circuits is required on the stand point of low consumption electric power. Therefore it is preferable to have a structure comprising an LDD region formed by disposing an offset region against the gate electrode ($L_{off}$) as shown in n-channel TFT 288 of FIG. 5B The structure of the present embodiment can be easily realized by manufacturing TFTs by referring to processes shown in Embodiments 1 to 3. While the present embodiment shows merely the structures for the pixel section and the driver circuits, it is possible to form on the same substrate by referring to Embodiment 1 or 2, other circuits such as signal divider circuits, frequency divider circuits, D/A converters, g compensation circuits, operation amplifier circuits and signal processing circuits such as memory circuits and operation processing circuits, and logic circuits.

Thus the present invention can materialize a semiconductor device comprising a pixel section and its driver circuits on the same substrate, such as a semiconductor device having a signal driver circuit and a pixel section.

EMBODIMENT 6

Figure 12:
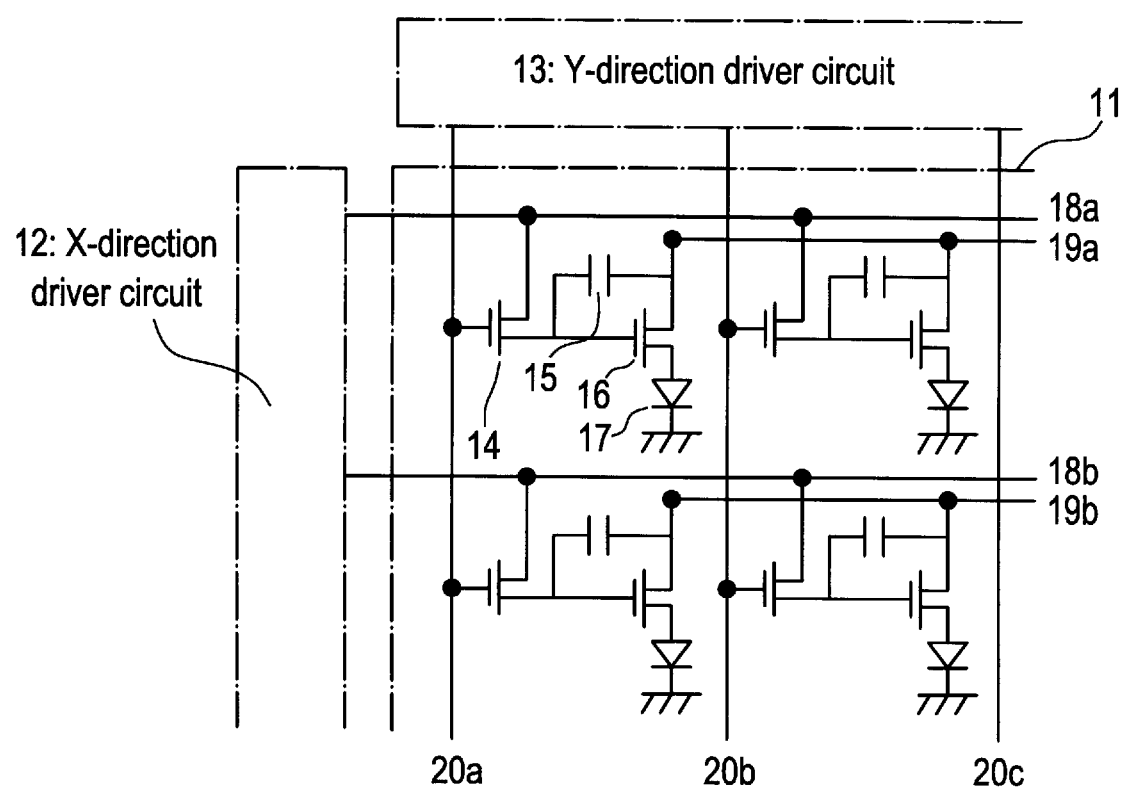
FIG. 12 illustrates the structure of an active matrix EL display device.

The present invention can be applied to an active matrix EL display device. FIG. 12 is a circuit diagram of an active matrix EL display device. An X direction driver circuit 12 and a Y direction driver circuit 13 are provided in the peripheral of a pixel section 11. Each pixel of the pixel section 11 comprises a switching TFT 14, a capacitor 15, a current control TFT 16 and an organic EL element, and X direction signal line 18a and Y direction signal line 20 are connected to the switching TFT 14 and electric source line 19a is connected to the current control TFT.

TFTs used for the X direction driver circuit 12, Y direction driver circuit 13 or current control TFT 17 are formed in the active matrix EL display device of the present invention by combining p-channel TFT 285, n-channel TFT 286 or n-channel TFT 287 of FIG. 5B. Further, the switching TFT 14 is formed by n-channel TFT 288 of FIG. 5B.

Note that any structure of Embodiments 1 to 3 may be combined to an active matrix EL display device of the present Embodiment.

EMBODIMENT 7

An active matrix substrate on which pixel section and driver circuits are integrally formed over a same substrate by applying the present invention can be used for various electro-optical devices (active matrix liquid crystal display device, active matrix EL display device or active matrix EC display device). Namely, the present invention may be applied to all of the electronic devices that incorporate these electro-optical devices as a display medium.

Following can be given as such electronic devices: a video camera; a digital camera; a projector (rear or front); a head mounted display (goggle type display); a car navigation system; a personal computer; a portable telephone; or an electronic book; etc. Examples of these are shown in FIGS. 14A to 14F.

Figure 14A:
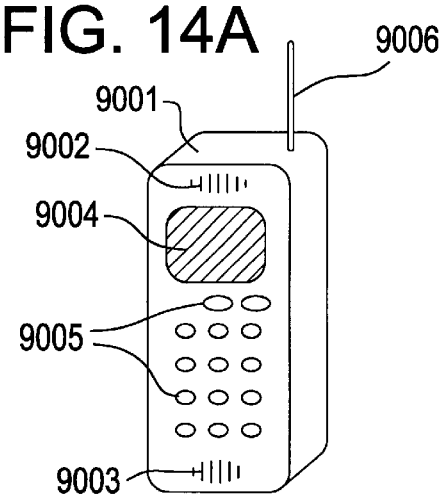
FIGS. 14A to 14F illustrate examples of a semiconductor device.

FIG. 14A is a portable telephone which comprises a main body 9001, a voice output section 9002, a voice input section 9003, a display device 9004, operation switches 9005 and an antenna 9006. The present invention can be applied to the display device 9004 comprising an active matrix substrate.

Figure 14B:
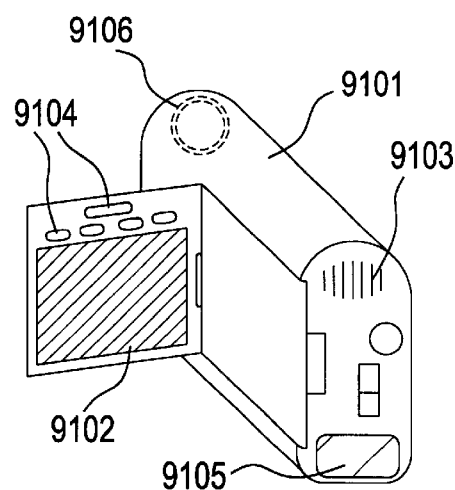

FIG. 14B is a video camera and comprises a main body 9101, a display device 9102, a voice input section 9103, operation switches 9104, a battery 9105 and image receiving section 9106. The present invention can be applied to the display device 9102 comprising an active matrix substrate.

Figure 14C:
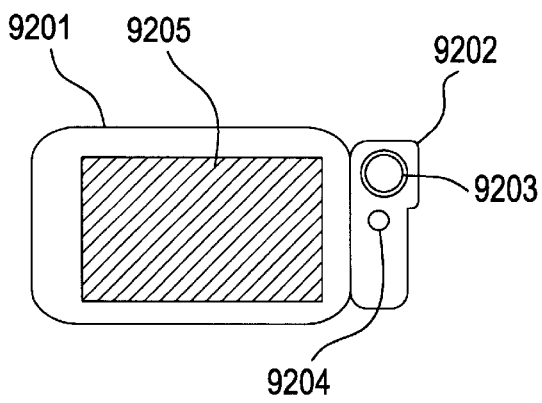

FIG. 14C is a mobile computer and comprises a main body 9201, a camera section 9202, an image receiving section 9203, operation switches 9204 and a display device 9205. The present invention can be applied to the display device 9205 comprising an active matrix substrate.

Figure 14D:
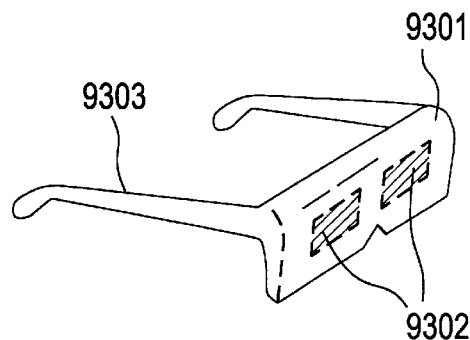

FIG. 14D is a goggle type display, and comprises a main body 9301, a display device 9302 and an arm section 9303. The present invention can be applied to the display device 9302. Though not shown, the present invention can be used for other signal control circuits.

Figure 14E:
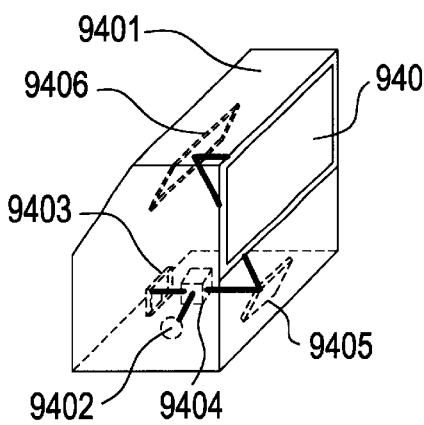

FIG. 14E is a rear projector, and comprises a main body 9401, a light source 9402, a display device 9403, a polarizing beam splitter 9404, reflectors 9405 and 9406 and a screen 9407. The present invention can be applied to the display device 9403.

Figure 14F:
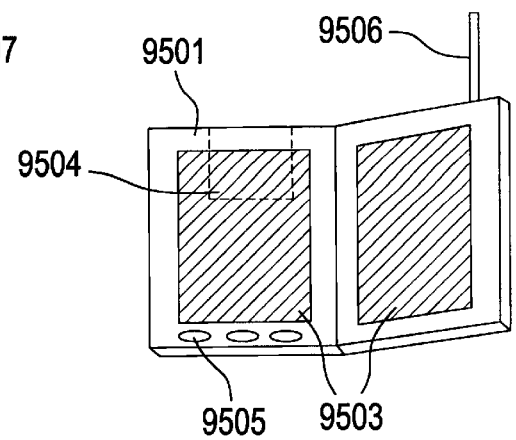

FIG. 14F is a portable book, and comprises a main body 9501, a display device 9503, a recording medium 9504, operation switches 9505 and an antenna 9506, and displays data recorded in a mini-disc (MD) or a DVD, or data received from the antenna. The display device 9503 of the present invention can be applied a direct-view type display device.

Figure 15A:
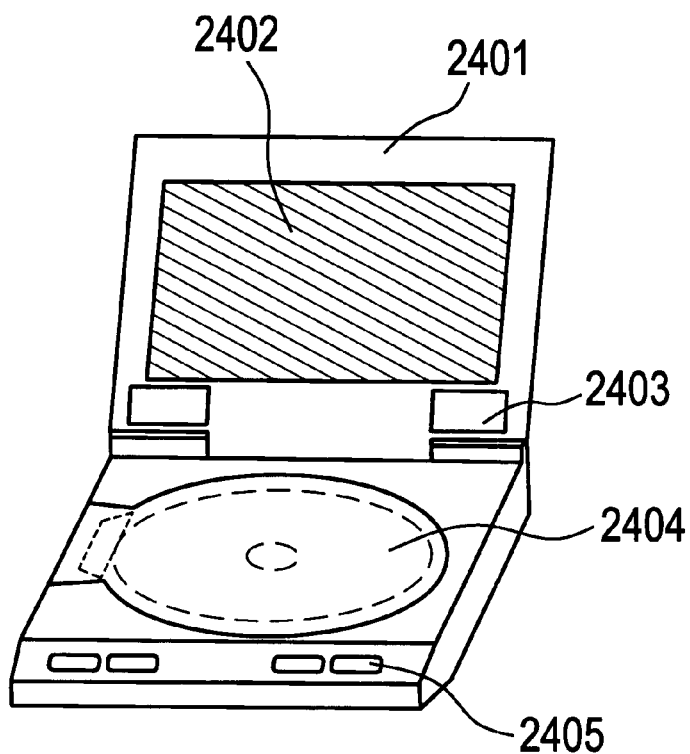
FIGS. 15A and 15B illustrate examples of a semiconductor device.

FIG. 15A is a player using a recording medium on which a program is recorded (hereinafter referred to as a recording medium), and comprises a main body 2401, a display device 2402, a speaker section 2403, a recording medium 2404, and operation switches 2405. Note that music appreciation, film appreciation, games and the use for the Internet can be performed with this device by using a DVD (digital versatile disk), a CD, etc., as a recording medium. The present invention can be applied to the display device 2402 and other signal control circuits.

Figure 15B:
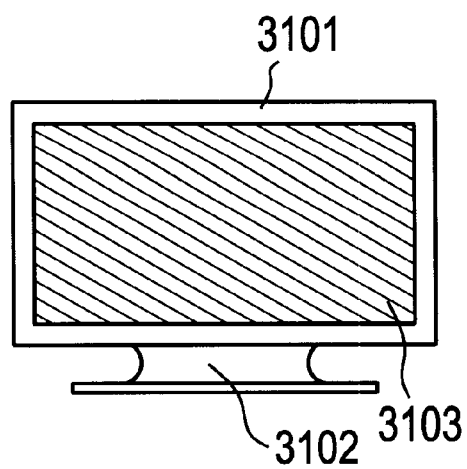

FIG. 15B is a display and comprises a main body 3101, supporting section 3102 and a display device 3103. The present invention can be applied to the display device 3103. The display of the present invention is specifically advantageous in case of making a large display, and it is advantageous in the display of diagonal 10 inches or greater (specifically 30 inches or greater).

Figure 16A:
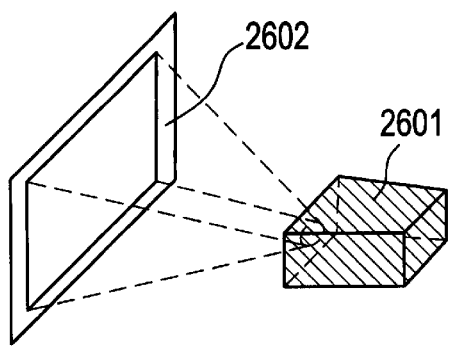
FIGS. 16A to 16D illustrate examples of a projector.

FIG. 16A is a front projector and comprises a projection system 2601 and a screen 2602. The present invention can be applied to a display device 2808 which comprises a part of the projection system 2601 and other signal control circuits.

Figure 16B:
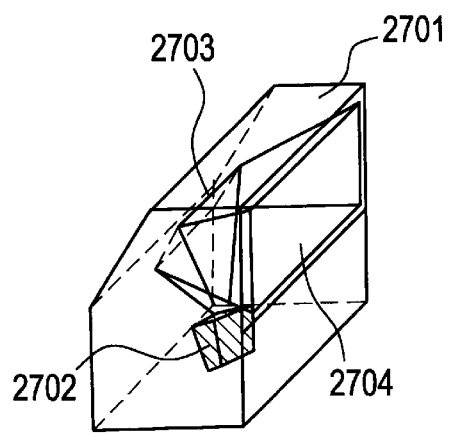

FIG. 16B is a rear projector comprising a main body 2701, a projection system 2702, a mirror 2703 and a screen 2704. The present invention can be applied to a display device 2808 which comprises a part of the projection system 2601 and other signal control circuits.

Figure 16C:
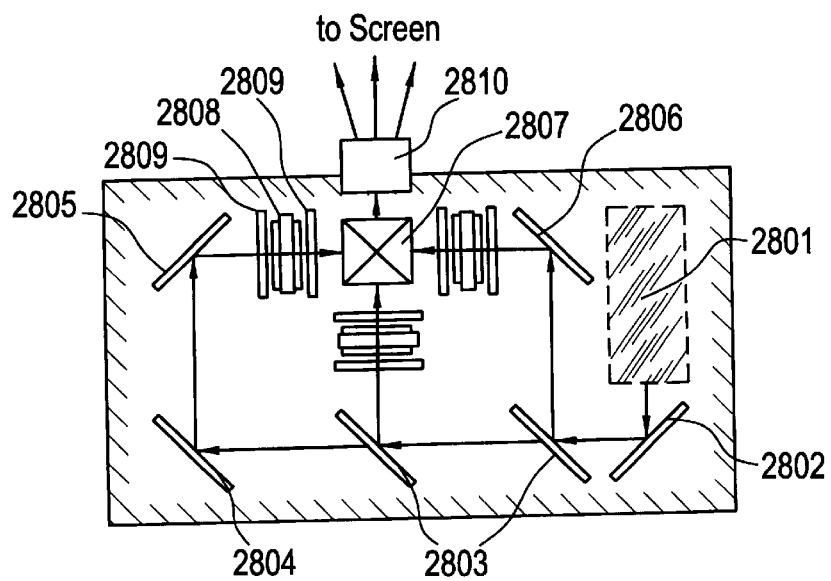
Figure 16D:
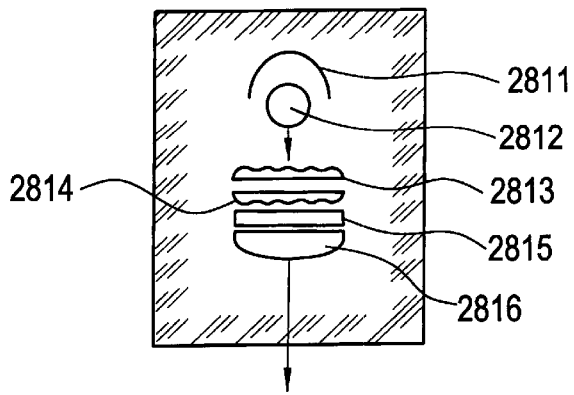

FIG. 16C shows an example of the structure of the projection systems 2601 and 2702 of FIGS. 16A and 16B. Projection systems 2601 and 2702 comprise a light source optical system 2801, mirrors 2802 and 2804 to 2806, a dichroic mirror 2803, a prism 2807, a liquid crystal display device 2808, phase differentiating plate 2809 and projection optical system 2810. The projection optical system comprises an optical system including a projection lens. Though the present embodiment showed an example of 3-plate type, it is not limited to this example and it may be a single plate type for instance. Further, an operator may set optical systems such as optical lenses, film having polarizing function, film to regulate the phase difference, IR films, etc., suitably within the light source optical system.

Provided, cases of using transmission type electro-optical devices are shown in the projector of FIGS. 16A and 16B, and application examples of reflection type electro-optical device and EL display device are not shown in the figures.

Though not shown here, the present invention can also be applied to a display device for a car navigation system, an image sensor or a personal computer. As shown above, the applicable range of the present invention is very large, and it is possible to apply to electric machines of various area. Further, electric devices of the present embodiment can be realized by utilizing structures of any combination of embodiments 1 to 6.

EMBODIMENT 8

Figure 17A:
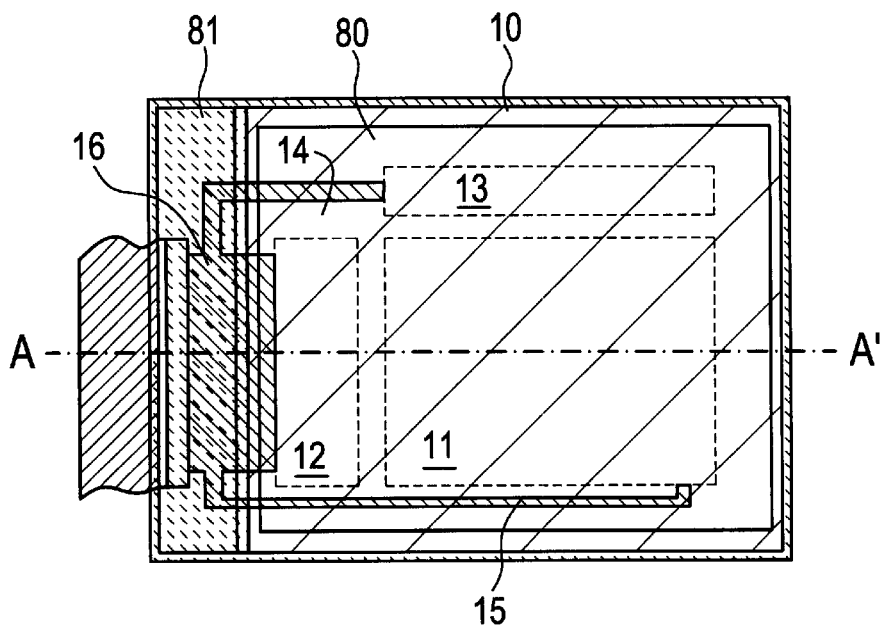
FIGS. 17A and 17B illustrate the structure of the upper surface of the EL display device and the structure of the EL display device in cross section.

An example of manufacturing a spontaneous light emittance type display panel using electro-luminescence (EL)

material (hereinafter referred to as EL display device) from an active matrix substrate similar to that of Embodiment 1 is described in the present embodiment. FIG. 17A shows a top view of the EL display panel. In FIG. 17A, reference numeral 10 is a substrate, 11 is a pixel section, 12 is a source side driver circuit, and 13 is a gate side driver circuit; each driver circuit reaches a FPC 17 through wirings 14 to 16, and then connected to the external devices.

Figure 17B:
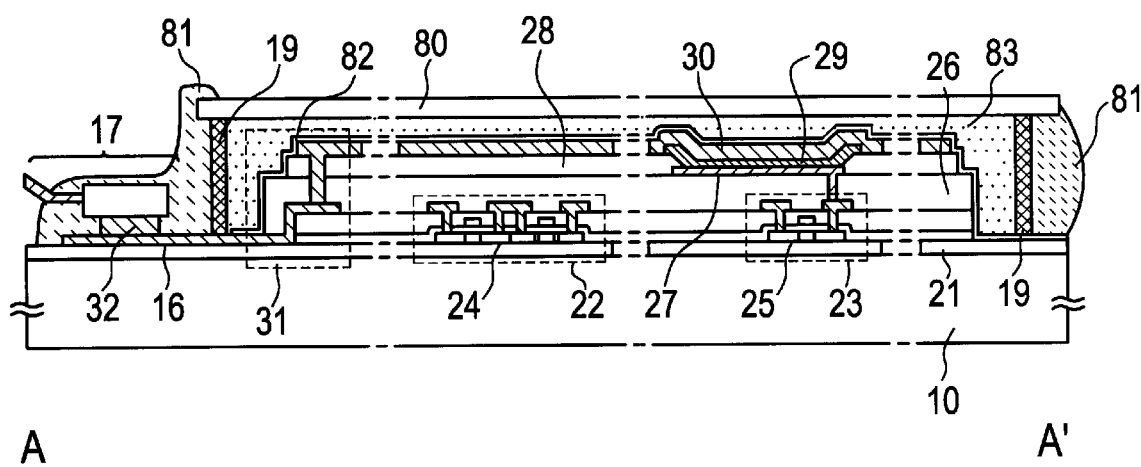

FIG. 17B shows a cross section corresponding at line A–A' of FIG. 17A. Here an opposite plate 80 is disposed over at least the pixel section, preferably over driver circuit and pixel section. Opposite plate 80 is stuck by a sealing material 19 to an active matrix substrate on which TFTs and spontaneous light emittance layer using EL material are formed. Filler (not shown in the Figure) is mixed into the sealing material 19 and the two substrates are stuck together to have an approximately uniform distance by this filler. Further the device has a structure to seal tight with sealant 81 on the outside of sealing material and the top and the peripheral of FPC 17. Sealant 81 uses a material such as silicone resin, epoxy resin, phenol resin, or butyl rubber, etc.

A space is formed in the inside when the active matrix substrate 10 and the opposite substrate 80 are stuck together by the sealant 19. Fillings 83 are filled in the space. This fillings 83 also as an effect of adhering the opposite plate 80. PVC (poly vinyl chloride), epoxy resin, silicon resin, PVB (poly vinyl butyral) or EVA (ethylene vinyl acetate) can be used as the Fillings 83. Because the spontaneous light emittance layer is weak against moisture and easy to deteriorate, it is preferable to form on the inside of the fillings 83 a drying agent such as barium oxide so that moisture absorption effect can be maintained. Further the device is structured to form a passivation film 82 over the spontaneous light emittance layer from silicon nitride film or silicon oxynitride film etc. so that corrosion by alkali elements etc. included in the fillings 83 is prevented.

A glass plate, an aluminum plate, a stainless plate, an FRP (fiberglass-reinforced plastic) plate, a PVF (poly vinyl fluoride) film, a Myler film (a trademark of I.E. du Pont de Nemours and Company), a polyester film, an acrylic film or an acrylic plate can be used for the opposite plate 80. Further, moisture resistance can be increased by using a sheet which has a structure of sandwiching an aluminum foil of several tens mm with PVF film or Myler Film™. In this way, EL elements are tightly sealed and shielded from the outer atmosphere.

In FIG. 17B, driver circuit TFT 22 (provided a CMOS circuit combining n-channel TFT and p-channel TFT is shown in the Figure) and TFT for pixel section 23 (provided TFT which controls electric current to an EL element is shown here) are formed over a substrate 10 and base film 21. Among these TFTs, the LDD region having a structure shown in the present embodiment mode is provided specifically in the n-channel TFT to prevent reduction of ON current due to hot carrier effect and characteristic deterioration due to Vth shift or bias stress.

For instance, p-channel TFT 146 and n-channel TFT 147 shown in FIG. 1 may be used for driver circuit TFT 22. Though it depends on the driving voltage, if the driver voltage is 10V or greater, the first n-channel TFT of FIG. 1 namely n-channel TFT 147 or p-channel TFT having the similar structure may be used for pixel section TFT. While the first n-channel TFT 147 is structured to dispose an LDD that overlaps with a gate electrode on the drain side, it is not necessarily disposed when the driving voltage is smaller than 10V because deterioration of TFT due to hot carrier effect can be almost ignored.

In order to fabricate an EL display device from an active matrix substrate in the state of FIG. 1, an interlayer insulating film (flattening film) 26 comprising a resin material is formed over the source wiring and the drain wiring, and a pixel electrode 27 comprising a transparent conductive film which is electrically connected to drain of pixel section TFT 23 thereon. A compound of indium oxide and tin oxide (referred to as ITO) or a compound of indium oxide and zinc oxide can be used for the transparent conductive film. After forming the pixel electrode 27, an insulating film 28 is formed, and an opening section is formed over a pixel electrode 27.

Next, a spontaneous light emittance layer 29 is formed. The spontaneous light emittance layer 29 may be a laminate structure or a single layer structure, and publicly known EL materials (hole injection layer, hole transport layer, light emittance layer, electron transport layer or electron injection layer) may be freely combined. A technique of public domain may be utilized regarding how it is structured. Further, there are small molecular material and polymer material for the EL material. Evaporation method is used in case of using a small molecular material, and a simple method of spin coating, printing or ink jet method etc can be used in case of using a polymer material.

The spontaneous light emittance layer may be formed by an evaporation method utilizing a shadow mask, or ink jet method or dispenser method. In either way, a colored display is possible by forming luminescent layers capable of emitting light of different wavelength per pixel (red light emitting layer, green light emitting layer and blue light emitting layer). Any other form may be used, such as combining color changing layers (CCM) with color filters, and combining white light emitting layers with color filters. Needless to say, a single color emitting EL display device is also possible.

After forming the spontaneous light emittance layer 29, a cathode 30 is formed on top. It is preferable to remove as much as possible of the moisture and oxygen existing in the interface between the cathode 30 and spontaneous light emittance layer 29. It is therefore necessary to take measures such as forming the spontaneous light emittance layer 29 and cathode 30 inside a vacuum by successive film deposition, or forming the spontaneous light emittance layer 29 in an inert atmosphere and then forming the cathode 30 without exposure to the atmosphere. It is possible to perform the above film deposition in the present embodiment by using a multi-chamber system (cluster tool system) deposition device.

Note that a laminate structure of a LiF (lithium fluoride) film and an Al (aluminum) film is used for the cathode 30 in embodiment 8. Specifically, a 1 nm thick LiF (lithium fluoride) film is formed on the spontaneous light emittance layer 29 by evaporation, and a 300 nm thick aluminum film is formed on top of that. Needless to say, an MgAg electrode, a known cathode material, may be used. The cathode 30 is connected to the wiring 16 in the region denoted with the reference numeral 31. The wiring 16 is a power supply line in order to supply a preset voltage to the cathode 30, and is connected to the FPC 17 through an anisotropic conductive paste material 32. A resin layer 80 is further formed on FPC 17, and adhesive strength in this section is increased.

In order to electrically connect the cathode 30 and the wiring 16 in the region denoted as reference numeral 31, it is necessary to form a contact hole in the interlayer insulating film 26 and the insulating film 28. The contact holes may be formed during etching of the interlayer insulating film 26 (when forming the pixel electrode contact hole) and during etching of the insulating film 28 (when forming the open section before forming the spontaneous light emittance layer). Further, etching may proceed in one shot all the way to the interlayer insulating film 26 when etching the insulating film 28. In this case the contact holes can have a good shape provided that the interlayer insulating film 26 and the insulating film 28 are the same resin material.

The wiring 16 is electrically connected to FPC 17 by passing through a space between sealing material 19 and substrate 10 (provided it is closed by sealant 81). Note that the explanation is made here in regard to wiring 16, but other wirings 14 and 15 are also electrically connected to FPC 17 passing through underneath the sealing material 18 in the similar way.

Figure 18A:
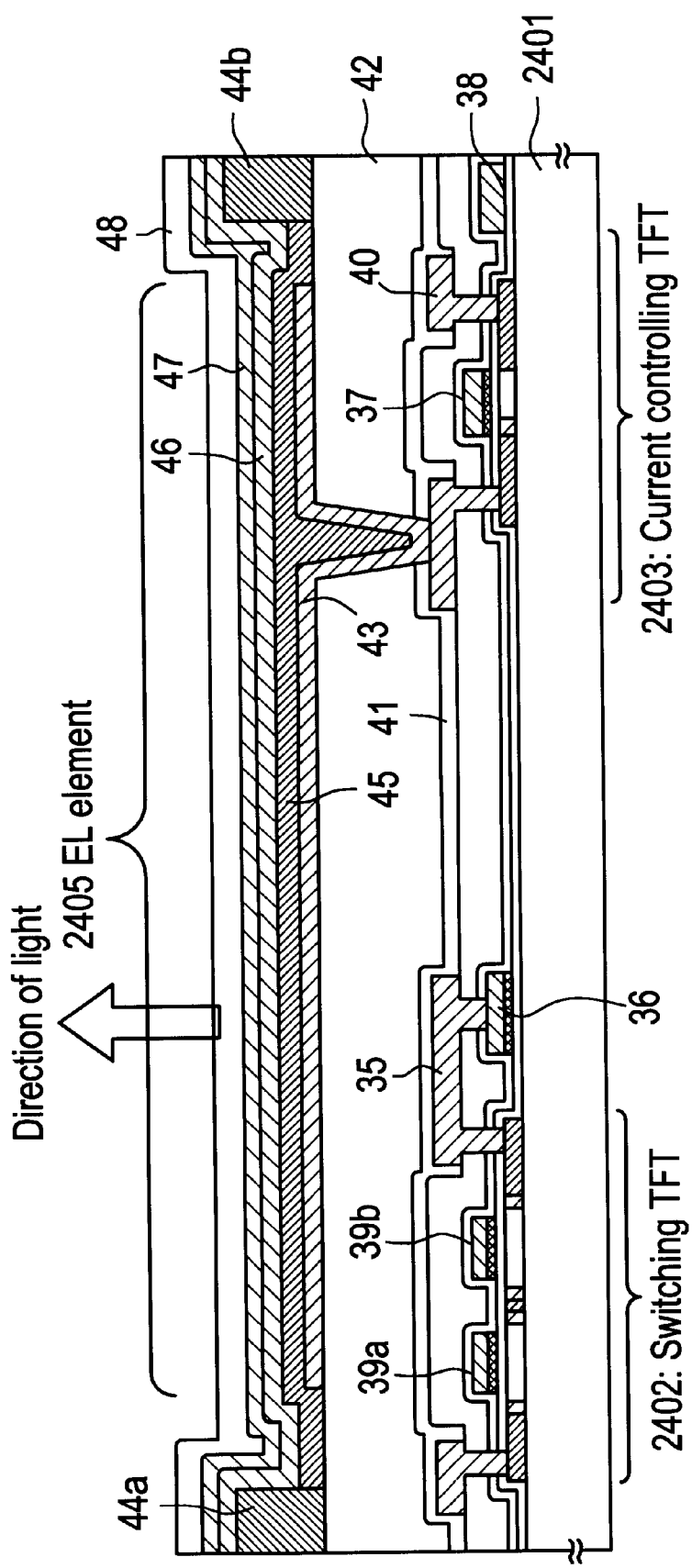
FIGS. 18A and 18B illustrate the constitutions of a pixel portion in the EL display device.
Figure 18B:
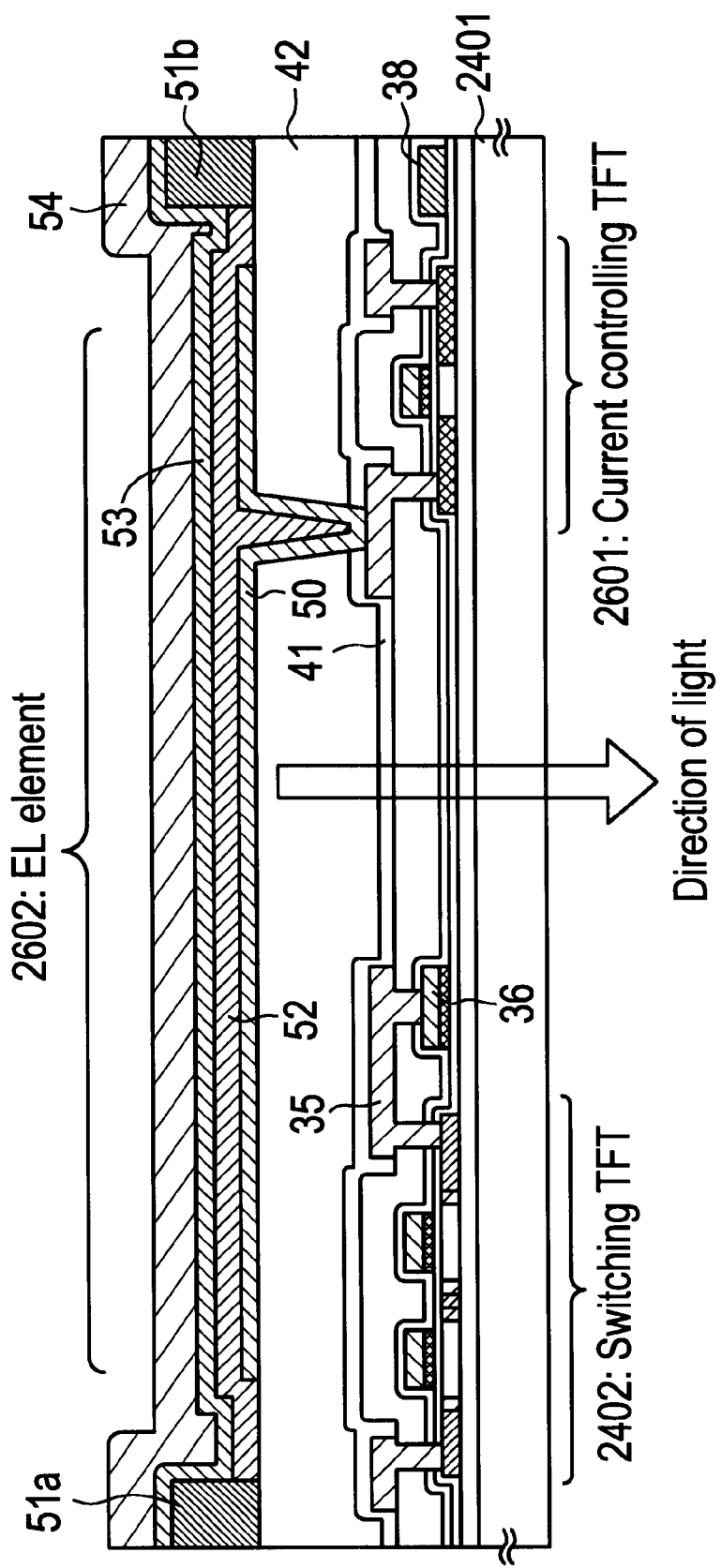
Figure 19A:
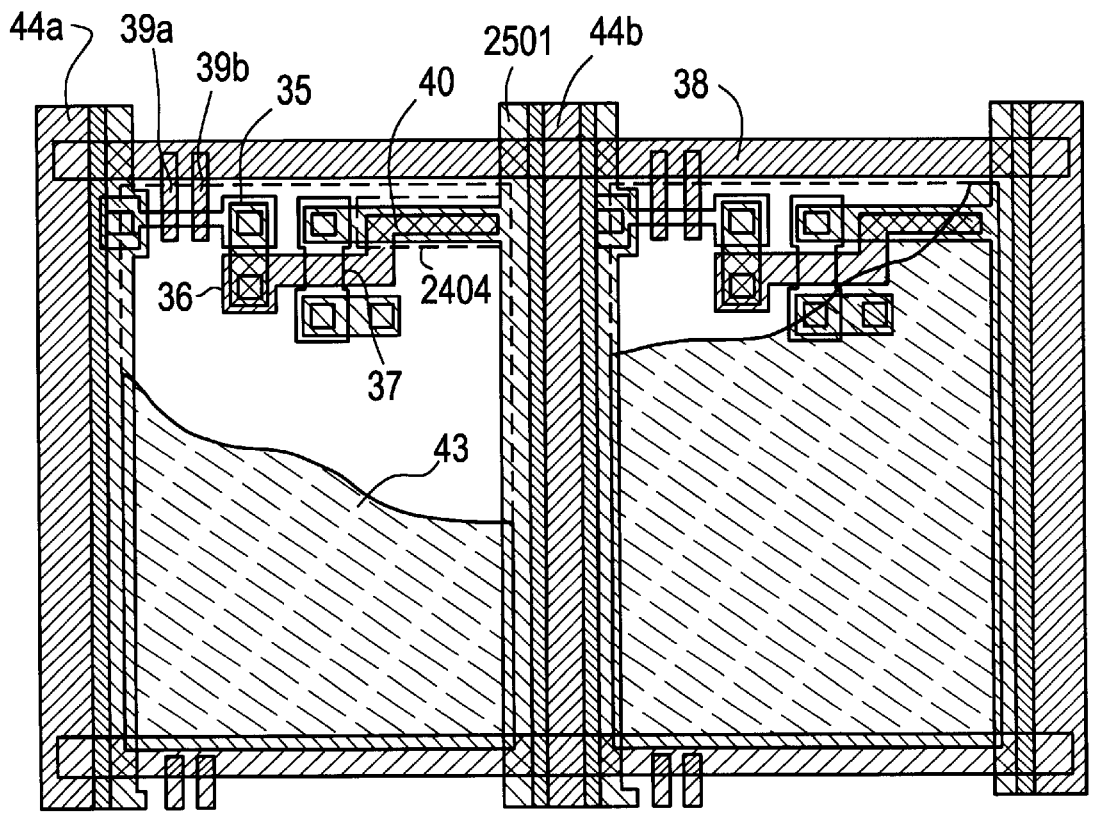
FIGS. 19A and 19B illustrate the top view of the EL display device and the circuit constitution, respectively.
Figure 19B:
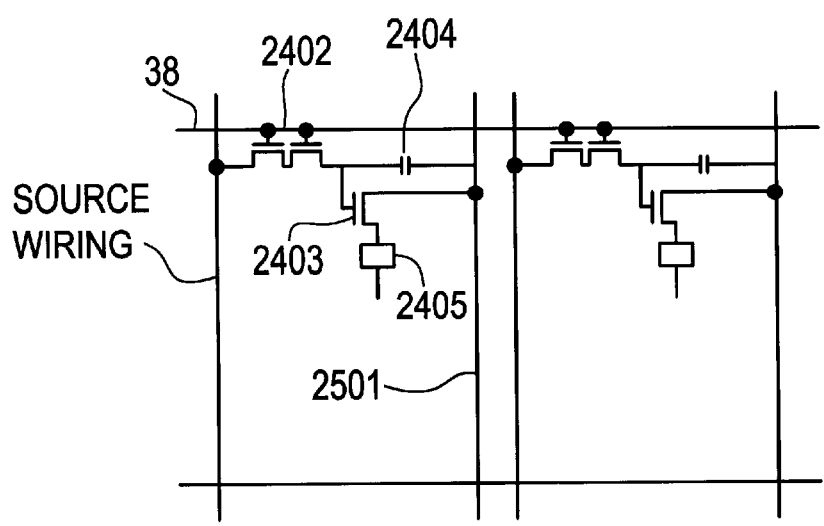

A more detailed cross sectional structure of the pixel section are shown here in FIGS. 18A and 18B, top view is shown in FIG. 19A and the circuit diagram is shown in FIG. 19B. In FIG. 18A, switching TFT 2402 provided on the substrate 2401 is formed in the same structure as pixel TFT 149 of FIG. 1 of embodiment mode 1. It becomes a structure in which 2 TFTs are connected in series by adopting double gate structure, and OFF current value can be reduced by forming LDD in offset region disposed not to overlap with the gate electrode. While the present embodiment uses a double gate structure, the structure may be a triple gate structure or a multi-gate structure having greater number of gates.

Further, current control TFT 2403 is formed by using the first n-channel TFT 147 shown in FIG. 1. This TFT structure is a structure in which LDD that overlaps with gate electrode is disposed only on the drain side, and that increases electric current driver capacity by reducing parasitic capacitance and series resistance between gate and drain. Also from other point of view, application of such a structure has a very important meaning. Because current control TFT is an element for controlling electric current amount that flow in the EL element, it is an element which has a higher risk of deterioration due to heat and of deterioration due to heat by flow of a lot of electric current. Deterioration of TFT can be prevented and operation stability can be increased by providing an LDD region that overlaps with a gate electrode in its part in the current control TFT. In this case, drain wiring 35 of switching TFT 2402 is electrically connected to gate electrode 37 of current control TFT through wiring 36. The wiring denoted as reference numeral 38 is a gate wiring that electrically connects gate electrodes 39a and 39b of switching TFT 2402.

Further, while the present embodiment shows a single gate structure for the electric current TFT 2403, it may be a multi-gate structure connecting a plurality of TFTs in series. Moreover, it may be a structure in which a plurality of TFTs are connected in parallel dividing the channel forming region in effect, and in which the heat emission is available with high efficiency. Such structure is effective as a counter measure for deterioration due to heat.

As shown in FIG. 19A, the wiring which becomes the gate electrode 37 of current control TFT 2403 overlaps with the drain wiring 40 of current control TFT 2403 by interposing an insulating film in the region denoted as reference numeral 2404. A capacitor is formed here in the region denoted as reference numeral 2404. This capacitor 2404 functions as a capacitor to hold voltage applied to the gate of current control TFT 2403. The drain wiring 40 is connected to current supply line (electric source line) 2501 and a constant voltage is always applied thereto.

A first passivation film 41 is formed on the switching TFT 2402 and current control TFT 2403, and a planarization film 42 comprising a resin insulating film is formed thereon. It is very important to flatten the level difference due to the TFT by using the planarization film 42. A spontaneous light emittance layer to be formed later is so thin that the presence of the level difference may sometimes cause trouble in emitting light. Therefore flattening is desirably carried out before forming a pixel electrode in order to form the spontaneous light emittance layer on the surface as flat as possible.

Denoted by 43 is a pixel electrode (cathode of the EL element) made of a conductive film with high reflectivity, which is electrically connected to the drain of the current controlling TFT 2403. Preferable material for the pixel electrode 43 is a low resistance conductive film such as an aluminum alloy film, a copper alloy film and a silver alloy film, or a lamination film of those films. Needless to say, those films may be used to form a lamination structure with other conductive films. Banks 44a and 44b made of an insulating film (preferably resin) form a groove (corresponding to pixel) therebetween to form a light emitting layer 44 in the groove. Though only one pixel is shown here, light emitting layers corresponding to the colors R (red), G (green) and B (blue), respectively, may be formed. As an organic EL material for forming the light emitting layer, p conjugate polymer material is used. Representative polymer materials include a polyparaphenylene vinylene (PPV)-, polyvinyl carbazole (PVK)-, and polyfluore- based materials, etc. Among PPV-based organic EL materials of various forms, usable material is one disclosed in, for example, H. Shenk, H. Becker, O. Gelsen, E. Kluge, W. Kreuder, and H. Spreitzer, "Polymers for Light Emitting Diodes," Euro Display, Proceedings, 1999, pp.33–37, or in Japanese Patent Application Laid-Open No. Hei 10-92576.

Specifically, cyanopolyphenylene vinylene is used for the light emitting layer for emitting red light, polyphenylene vinylene is used for the light emitting layer for emitting green light, and polyphenylene vinylene or polyalkylphenylene is used for the light emitting layer for emitting blue light. Appropriate film thickness thereof is 30 to 150 nm (preferably 40 to 100 nm). However, the description above is an example of an organic EL material usable as the light emitting layer and there is no need to limit the present invention thereto. The spontaneous light emittance layer (a layer for emitting light and for moving carriers to emit light) may be formed by freely combining the light emitting layer, electric charge transport layer and an electric charge injection layer. Instead of the polymer material that is used as the light emitting layer in the example shown in this embodiment, for instance, a small molecular organic EL material may be used. It is also possible to use an inorganic material such as silicon carbide for the electric charge transport layer and the electric charge injection layer. Known materials may be used for these organic EL materials and inorganic materials.

The spontaneous light emittance layer in this embodiment has a lamination structure in which a hole injection layer 46 comprising PEDOT (polytiophene) or Pani (polyaniline) is layered on the light emitting layer 45. In the case of this embodiment, light produced in the light emitting layer 45 is emitted toward the top face (upwards beyond the TFTs), which requires an anode having light transmissivity. The transparent conductive film may be formed from a compound of indium oxide and tin oxide or a compound of indium oxide and zinc oxide, and preferred material is one that can be formed into a film at a temperature as low as possible because the transparent conductive film is formed after forming the light emitting layer and the hole injection layer which have low heat resistance.

A spontaneous light emitting element 2045 is completed upon formation of the anode 47. The spontaneous light emitting element 2045 here refers to a capacitor consisting of the pixel electrode (cathode) 43, the light emitting layer 45, the hole injection layer 46 and the anode 47. As shown in FIG. 19A, the pixel electrode 43 extends almost all over the area of the pixel, so that the entire pixel functions as the spontaneous light emitting element. Therefore light emittance efficiency is very high, resulting in bright image display.

In this embodiment, a second passivation film 48 is further formed on the anode 47. Preferred second passivation film 48 is a silicon nitride film or a silicon oxynitride film. A purpose of this second passivation film is to shut the spontaneous light emitting element from the external with the intention of preventing degradation of the organic EL material due to oxidation as well as suppressing degassing from the organic EL material. This enhances reliability of the EL display device.

As described above, the EL display panel of this embodiment includes the pixel section comprising pixels that has the structure as shown in FIG. 19A, the switching TFT sufficiently low in OFF current value, and the current controlling TFT strong against hot carrier injection. Thus obtained is the EL display panel that has high reliability and is capable of excellent image display.

FIG. 18B shows an example of inverting the structure of spontaneous light emittance layer. The current control TFT 2601 is formed by the same structure as p-channel TFT 146 of FIG. 1. A transparent conductive film is used as the pixel electrode (anode) 50 in this embodiment. Specifically, a conductive film made from a compound of indium oxide and zinc oxide is used. Needless to say, a conductive film made from a compound of indium oxide and tin oxide may be used too.

After forming banks 51a and 51b made of an insulating film, a light emitting layer 52 comprising polyvinyl carbazole is formed by applying a solution. An electron injection layer 53 comprising potassium acetylacetonate (denoted as acacK) and a cathode 54 made of an aluminum alloy are formed thereon. In this case, the cathode 54 functions also as a passivation film. An EL element 2602 is thus formed. In this embodiment, light produced in the light emitting layer 52 is emitted, as indicated by the arrow in the drawing, toward the substrate on which TFTs are formed. It is preferable to form the current control TFT 2601 by p-channel TFT in case of applying the structure of the present example.

The EL display device shown in this embodiment can be utilized as a display section of electronic devices of Embodiment 7.

EMBODIMENT 9

Figure 20A:
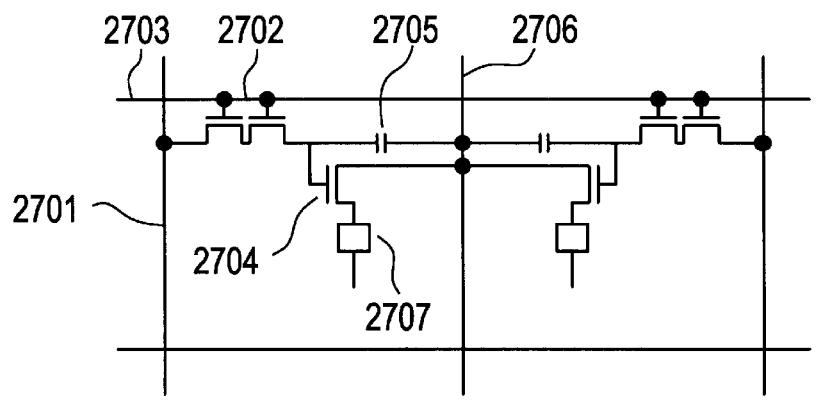
FIGS. 20A to 20C illustrate the circuit constitutions of the EL display device.
Figure 20B:
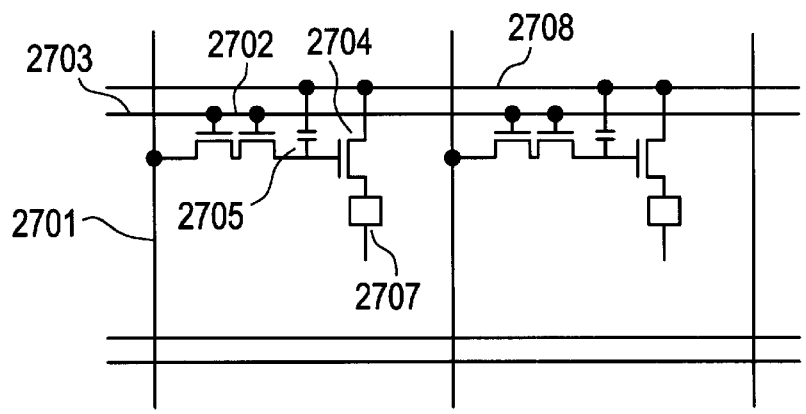
Figure 20C:
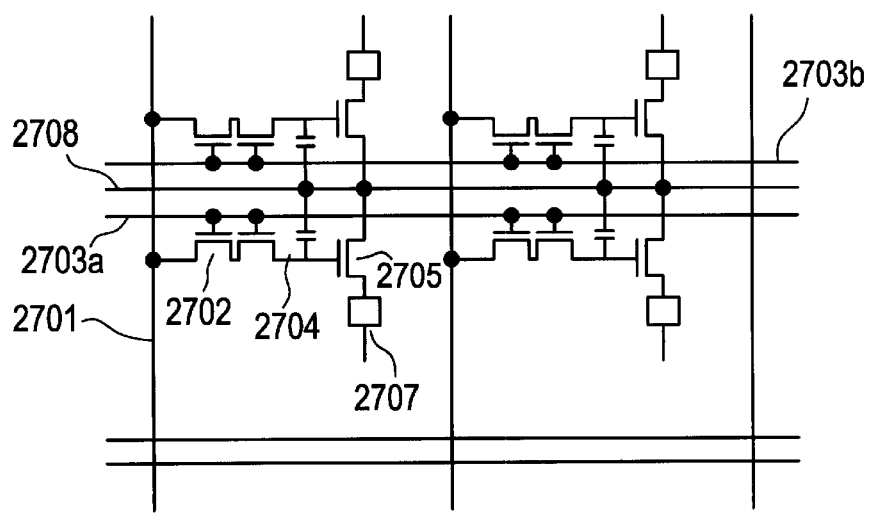

This embodiment shows in FIGS. 20A to 20C, examples where a pixel has a different structure from the one shown in the circuit diagram of FIG. 19B. In this embodiment, reference numeral 2701 denotes a source wiring of a switching TFT 2702; 2703, gate wirings of the switching TFT 2702; 2704, a current controlling TFT; 2705, a capacitor; 2706 and 2708, electric current supply line; and 2707, an EL element.

FIG. 20A shows an example in which the current supply line 2706 is shared by two pixels. In other words, this example is characterized in that two pixels are formed so as to be axisymmetric with respect to the current supply line 2706. In this case, the number of current supply lines can be reduced, further enhancing the definition of the pixel section.

FIG. 20B shows an example in which the current supply line 2708 is arranged in parallel with the gate wirings 2703. Though the current supply line is arranged so as not to overlap with the gate wirings 2703 in FIG. 20B, the two may overlap with each other through an insulating film if the lines are formed in different layers. In this case, the current supply line 2708 and the gate wirings 2703 can share their occupying area, further enhancing the definition of the pixel section.

An example shown in FIG. 20C is characterized in that the current supply line 2708 is arranged, similar to the structure in FIG. 20B, in parallel with the gate wirings 2703a and 2703b and, further, two pixels are formed to be axisymmetric with respect to the current supply line 2708. It is also effective to arrange the current supply line 2708 so as to overlap with one of the gate wirings 2703. In this case, the number of current supply lines can be reduced, further enhancing the definition of the pixel section. Though a capacitor 2704 is provided in order to hold voltage applied onto the gate of current control TFT 2403 in FIGS. 20A and 20B, it is possible to omit capacitor 2704.

Because n-channel TFT of the present invention as shown in FIG. 18A is used as the current control TFT 2403, it has an LDD region provided to overlap with the gate electrode by interposing a gate insulating film. In general a parasitic capacitance called a gate capacitance is formed in this overlapped region, and the present embodiment is characterized in that it positively uses the parasitic capacitance in place of a capacitor 2704. Because the capacitance of this parasitic capacitance varies by the overlapped area of the gate electrode and the LDD region, it is determined by the length of the LDD region included in the overlapped region. Further, it is possible to omit capacitor 2705 in the structures of FIGS. 20A to 20C, similarly.

Note that the circuit structure of an EL display device shown in the present embodiment may be selected from the structure of TFTs shown in embodiment 1 to form a circuit shown in FIGS. 20A to 20C. It is possible to use an EL display panel of the present embodiment as a display section of the electronic devices of Embodiment 7.

EMBODIMENT 10

Accompanied by high definition and increase in gray scale number of the pixels, suppression of OFF current value of the pixel TFT is an important item in fabricating a high quality display device. The present embodiment shows a result of testing what TFT structure is appropriate for suppressing the OFF current value, by taking notice to the OFF current values under 2 bias states.

One of the OFF current values defined here is an OFF current value under the drain voltage ($V_{DS}$)=1V and the gate voltage ($V_{GS}$)=−17.5V, and is denoted as I(off)1. The other is an OFF current value under the drain voltage ($V_{DS}$)=14V and the gate voltage ($V_{GS}$)=−4.5V, and is denoted as I(off)2. The polarity of VGS shown here is the one corresponding to n-channel TFT, and the opposite polarity is taken in the case of p-channel TFT. It is presumed in I(off)1 that the slope of the band becomes steep due to high gate voltage and that the tunnel current is dominant among the current that flows. The amount of this current is effected by the interface state between the gate insulating film and the semiconductor layer, and the crystallinity of the semiconductor layer. On the other hand, it can be foreseen that I(off)2 is a leak current determined by the junction state between the channel forming region and the source/drain regions.

Figure 21A:
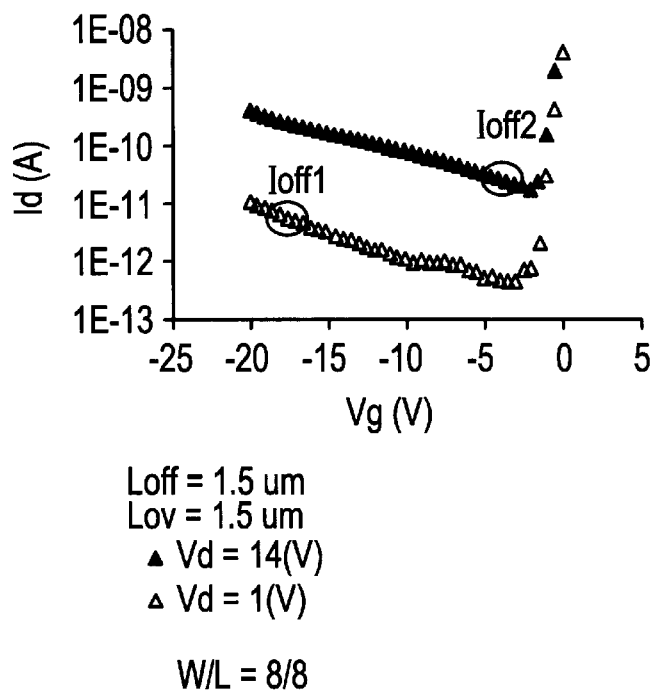
FIGS. 21A and 21B illustrate the OFF current dependance on drain voltage.
Figure 21B:
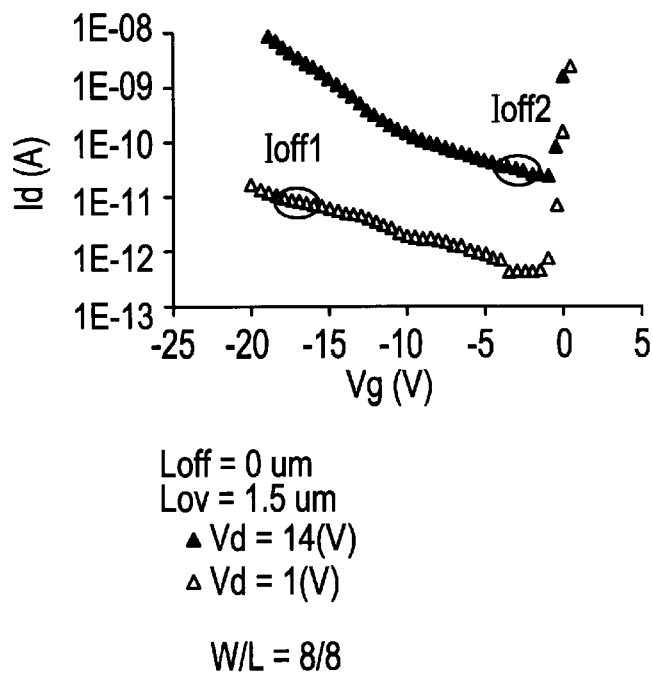

Embodiment 1 may be referred for the TFT manufacturing conditions however manufacturing conditions for $L_{ov}$ and $L_{off}$ are suitably altered after comparison. FIGS. 21A and 21B show the result of testing the influence of existence of $L_{off}$ imposed upon OFF current. By comparing the TFT characteristic disposing Loff=1.5 mm shown in FIG. 21A and the TFT characteristic not disposing $L_{off}$ shown in FIG. 21B, a significant difference is not found between I(off)1 and I(off)2. It means that the leak current is large as VDS becomes high provided VGS is the same.

Figure 22:
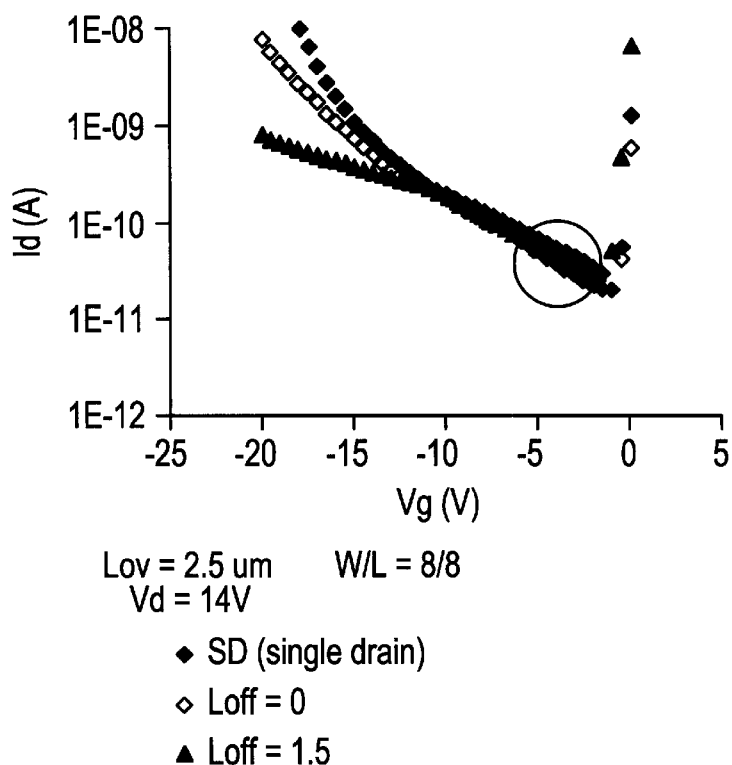
FIG. 22 illustrates the $L_{off}$ effect on OFF current.

FIG. 22 shows the results of examining drain structure dependence of the OFF current, and samples having 3 kinds of structures on the drain side, namely structure having single drain, structure having $L_{ov}$, and structure having both $L_{ov}$ and $L_{off}$. What is clarified in the characteristic of FIG. 22 is that the leak current do not change notwithstanding the existence of $L_{off}$ as long as $L_{ov}$ is included, even when the sample of structure having single drain is excluded from consideration.

Figure 23:
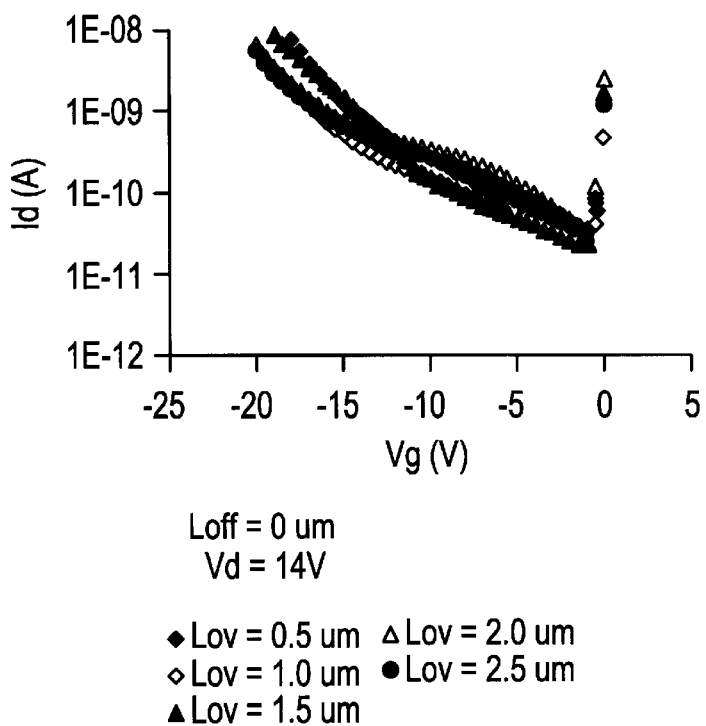
FIG. 23 illustrates the $L_{ov}$ dependance on OFF current.
Figure 24:
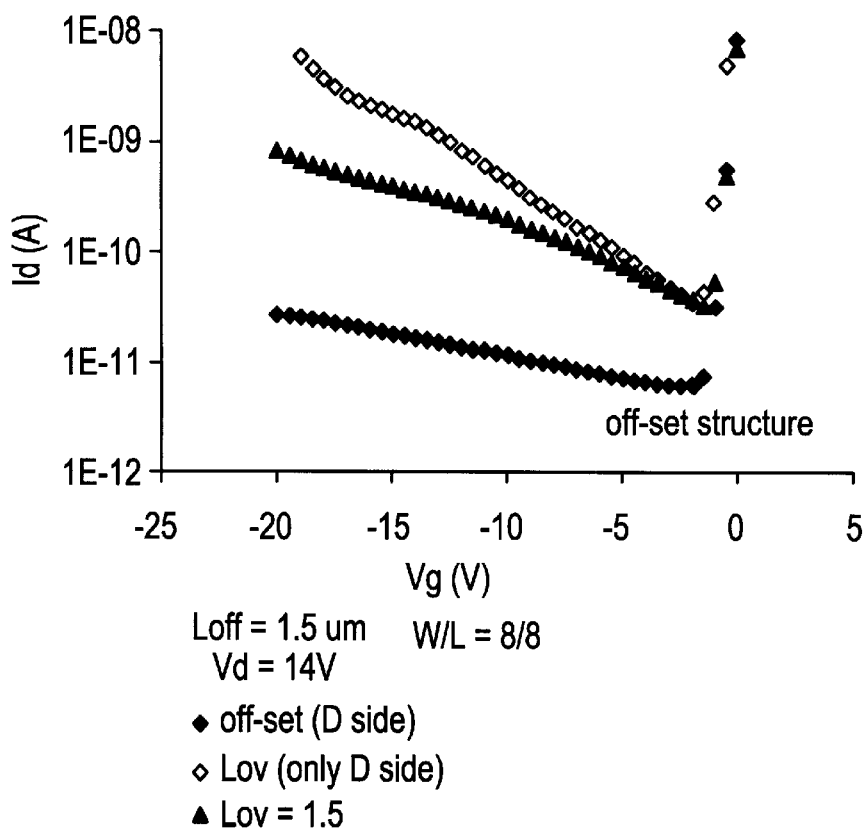
FIG. 24 illustrates the offset effect on OFF current.

FIG. 23 shows $L_{ov}$ dependence of Off current, and it indicates that the OFF current depend on the length of $L_{ov}$. FIG. 24 shows a result of comparing three samples of providing $L_{ov}$ on drain side only, providing $L_{ov}$ on both source and drain sides and providing an offset region on the drain side, and indicates that the OFF current can be reduced by providing an offset region.

As shown above, OFF current increases by existence of $L_{ov}$, and it also depends of the length of $L_{ov}$. $L_{ov}$ is necessary for suppressing hot carrier effect however in case of pixel TFT where drain voltage resistance is not required and rather required to reduce OFF current, it can be decided that the structure not disposing $L_{ov}$ is appropriate. However reduction of leak current is impossible in the single drain structure. In order to secure reliability through a long period of time, the conclusion is lead that a method of optimizing $L_{off}$ concentration is suitable for relieving the electric field concentrated around drain. Namely, an attempt was made to minimize the deterioration by optimization of $L_{off}$ concentration against the deterioration due to the hot carrier effect.

Figure 25:
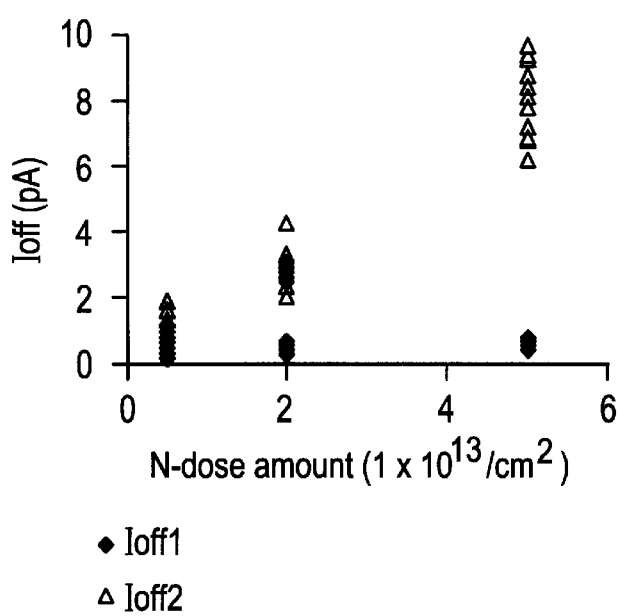
FIG. 25 illustrates the dose amount dependance of n-type impurity element doped in $L_{off}$ region on OFF current.

It was found that the impurity concentration suitable for decreasing I(off)2 is a dose amount of $5\times10^{12}$ to $2\times10^{13}/cm^2$ (acceleration voltage 80 keV), as shown in FIG. 25.

As shown above, it was clarified that it is necessary to optimize the impurity concentration of $L_{off}$ without disposing $L_{ov}$ in case of aiming at reduction of OFF current. Further, it was indicated that an offset region is extremely effective for the purpose of reducing OFF current.

The present invention can make it possible to, in a semiconductor device where a plurality of function circuits are formed on the same substrate (here, more specifically, an electro-optical device), dispose TFTs having appropriate performance depending on the required specification of the respective function circuits, and the operating characteristics and the reliability of the semiconductor device can be greatly improved.

In particular, by forming the LDD regions of the n-channel type TFT of the pixel portion so as to have the concentration of n⁻ and so as to be $L_{off}$ regions only, the OFF current value can be greatly decreased, which contributes to lower consumed power of the pixel portion. Further, by forming the LDD regions of the n-channel type TFTs of the driving circuit so as to have the concentration of n⁻ and so as to be $L_{ov}$ regions only, the current driving capacity can be enhanced, the deterioration due to the hot carrier can be prevented, and the deterioration of the ON current value can be decreased. Still further, the operating performance and the reliability of a semiconductor device having such an electro-optical device as a display medium (here, more specifically, an electronic apparatus) can also be improved.

What is claimed is:

1. A semiconductor device comprising a pixel portion and a driver circuit for driving said pixel portion formed over a same substrate, said pixel portion comprising:
   an n-channel type thin film transistor over said substrate, said n-channel type thin film transistor comprising:
      a semiconductor layer having at least a source region, a drain region, a channel forming region, and a lightly doped region; and
      a gate electrode adjacent to said channel forming region with a gate insulating film interposed therebetween,
      wherein said lightly doped region is disposed so as not to overlap said insulating gate electrode, and an offset region is formed between said channel forming region and said lightly doped region, and
   said driver circuit comprising:
      a first and a second n-channel type thin film transistors over said substrate, each of said first and said second n-channel type thin film transistors comprising:
         a semiconductor layer having at least a source region, a drain region, a channel forming region, and a lightly doped region; and
         a gate electrode adjacent to said channel forming region with a gate insulating film interposed therebetween,
         wherein said lightly doped region of said first n-channel type thin film transistor is disposed so as to overlap said gate electrode of said first n-channel type thin film transistor,
         wherein said lightly doped region of said second n-channel type thin film transistor is disposed so as to at least partly overlap said gate electrode of said second n-channel type thin film transistor.

2. A semiconductor device according to claim 1, wherein an n-type impurity element contained in said lightly doped regions of said first and of said second n-channel type thin film transistor of said driver circuit is larger than that contained in said lightly doped region of said n-channel type thin film transistor of said pixel portion.

3. A semiconductor device according to claim 1, wherein an n-type impurity element contained in said lightly doped regions of said first and said second n-channel type thin film transistor of said driver circuit is two to ten times as large as that contained in said lightly doped region of said n-channel type thin film transistor of said pixel portion.

4. A semiconductor device according to claim 1, wherein a concentration of n-type impurity element contained in said lightly doped regions of said first and said second n-channel type thin film transistor of said driver circuit is from $2\times10^{16}$ to $5\times10^{19}$ atoms/cm³ and a concentration of n-type impurity element contained in said lightly doped region of said n-channel type thin film transistor of said pixel portion is from $1\times10^{16}$ to $5\times10^{18}$ atoms/cm³.

5. A semiconductor device according to claim 1, wherein said offset region is formed of a semiconductor film having the same composition as that of said channel forming region abutting against said offset region.

6. A semiconductor device according to claim 1, wherein a p-type impurity element is contained in said offset region at a concentration from $1\times10^{15}$ to $1\times10^{18}$ atoms/cm³.

7. A semiconductor device according to claim 1, wherein a storage capacitance is formed from a semiconductor layer connected with said n-channel type thin film transistor of said pixel portion and containing an n-type impurity element, capacitance wirings, and an insulating film between said semiconductor layer and said capacitance wirings in said pixel portion.

8. A semiconductor device according to claim 1, wherein said semiconductor device is an electro-luminescence display device.

9. A semiconductor device according to claim 1, wherein said semiconductor device is one selected from the group consisting of a portable telephone, a video camera, a mobile computer, a goggle type display, a projector, a portable book, a digital camera, a car navigation system, and a personal computer.

10. A semiconductor device according to claim 1, wherein said first n-channel type thin film transistor is incorporated in at least one selected from the group consisting of a shift register circuit, a level shifter circuit, and a buffer circuit.

11. A semiconductor device according to claim 1, wherein said second n-channel type thin film transistor is incorporated in a sampling circuit.

12. A semiconductor device comprising a pixel portion and a driver circuit for driving said pixel portion formed over a same substrate, said pixel portion comprising:
an n-channel type thin film transistor over said substrate, said n-channel type thin film transistor comprising:
a semiconductor layer having at least a source region, a drain region, a channel forming region, and a lightly doped region; and
a gate electrode adjacent to said channel forming region with a gate insulating film interposed therebetween,
wherein said lightly doped region is disposed so as not to overlap said gate electrode, and an offset region is formed between said channel forming region and said lightly doped region, and
said driver circuit comprising:
a first and a second n-channel type thin film transistors over said substrate, each of said first and said second n-channel type thin film transistors comprising:
a semiconductor layer having at least a source region, a drain region, a channel forming region, and a lightly doped region; and
a gate electrode adjacent to said channel forming region with a gate insulating film interposed therebetween,
wherein said lightly doped region of said first n-channel type thin film transistor is disposed so as to entirely overlap said gate electrode of said first n-channel type thin film transistor,
wherein said lightly doped region of said second n-channel type thin film transistor is disposed so as to partly overlap said gate electrode of said second n-channel type thin film transistor.

13. A semiconductor device according to claim 12, wherein an n-type impurity element contained in said lightly doped regions of said first and of said second n-channel type thin film transistor of said driver circuit is larger than that contained in said lightly doped region of said n-channel type thin film transistor of said pixel portion.

14. A semiconductor device according to claim 12, wherein an n-type impurity element contained in said lightly doped regions of said first and said second n-channel type thin film transistor of said driver circuit is two to ten times as large as that contained in said lightly doped region of said n-channel type thin film transistor of said pixel portion.

15. A semiconductor device according to claim 12, wherein a concentration of n-type impurity element contained in said lightly doped regions of said first and said second n-channel type thin film transistor of said driver circuit is from $2\times10^{16}$ to $5\times10^{19}$ atoms/cm$^3$ and a concentration of n-type impurity element contained in said lightly doped region of said n-channel type thin film transistor of said pixel portion is from $1\times10^{16}$ to $5\times10^{18}$ atoms/cm$^3$.

16. A semiconductor device according to claim 12, wherein said offset region is formed of a semiconductor film having the same composition as that of said channel forming region abutting against said offset region.

17. A semiconductor device according to claim 12, wherein a p-type impurity element is contained in said offset region at a concentration from $1\times10^{15}$ to $1\times10^{18}$ atoms/cm$^3$.

18. A semiconductor device according to claim 12, wherein a storage capacitance is formed from a semiconductor layer connected with said n-channel type thin film transistor of said pixel portion and containing an n-type impurity element, capacitance wirings, and an insulating film between said semiconductor layer and said capacitance wirings in said pixel portion.

19. A semiconductor device according to claim 12, wherein said semiconductor device is an electro-luminescence display device.

20. A semiconductor device according to claim 12, wherein said semiconductor device is one selected from the group consisting of a portable telephone, a video camera, a mobile computer, a goggle type display, a projector, a portable book, a digital camera, a car navigation system, and a personal computer.

21. A semiconductor device according to claim 12, wherein said first n-channel type thin film transistor is incorporated in at least one selected from the group consisting of a shift register circuit, a level shifter circuit, and a buffer circuit.

22. A semiconductor device according to claim 12, wherein said second n-channel type thin film transistor is incorporated in a sampling circuit.

23. A semiconductor device comprising a pixel portion and a driver circuit for driving said pixel portion formed over a same substrate, said pixel portion comprising:
an n-channel type thin film transistor over said substrate, said n-channel type thin film transistor comprising:
a semiconductor layer having at least a source region, a drain region, a channel forming region, and a lightly doped region; and
a gate electrode adjacent to said channel forming region with a gate insulating film interposed therebetween,
wherein said lightly doped region is disposed so as not to overlap said gate electrode, and
said driver circuit comprising:
a first and a second n-channel type thin film transistors over said substrate, each of said first and said second n-channel type thin film transistors comprising:
a semiconductor layer having at least a source region, a drain region, a channel forming region, and a lightly doped region; and
a gate electrode adjacent to said channel forming region with a gate insulating film interposed therebetween,
wherein said lightly doped region of said first n-channel type thin film transistor is disposed so as to entirely overlap said gate electrode of said first n-channel type thin film transistor,
wherein said lightly doped region of said second n-channel type thin film transistor is disposed so as to partly overlap said gate electrode of said second n-channel type thin film transistor.

24. A semiconductor device according to claim 23, wherein said first n-channel type thin film transistor is incorporated in at least one selected from the group consisting of a shift register circuit, a level shifter circuit, and a buffer circuit.

25. A semiconductor device according to claim 23, wherein said second n-channel type thin film transistor is incorporated in a sampling circuit.

26. A semiconductor device according to claim 23, wherein said semiconductor device is an electroluminescence display device.

27. A semiconductor device according to claim 23, wherein said semiconductor device is one selected from the group consisting of a portable telephone, a video camera, a mobile computer, a goggle type display, a projector, a portable book, a digital camera, a car navigation system, and a personal computer.

28. A semiconductor device comprising a pixel portion and a driver circuit for driving said pixel portion formed over a same substrate, said pixel portion comprising:
   an n-channel type thin film transistor over said substrate, said n-channel type thin film transistor comprising:
      a semiconductor layer having at least a source region, a drain region, a channel forming region, and a lightly doped region; and
      a gate electrode adjacent to said channel forming region with a gate insulating film interposed therebetween,
      wherein said lightly doped region is disposed so as not to overlap said gate electrode, and
   said driver circuit comprising:
      a first and a second n-channel type thin film transistors over said substrate, each of said first and said second n-channel type thin film transistors comprising:
         a semiconductor layer having at least a source region, a drain region, a channel forming region, and a lightly doped region comprising an n-type impurity between $2 \times 10^{16}$ and $5 \times 10^{19}$ atoms/cm$^3$; and
         a gate electrode adjacent to said channel forming region with a gate insulating film interposed therebetween,
         wherein said lightly doped region of said first n-channel type thin film transistor is disposed so as to entirely overlap said gate electrode of said first n-channel type thin film transistor,
         wherein said lightly doped region of said second n-channel type thin film transistor is disposed so as to partly overlap said gate electrode of said second n-channel type thin film transistor.

29. A semiconductor device according to claim 28, wherein said first n-channel type thin film transistor is incorporated in at least one selected from the group consisting of a shift register circuit, a level shifter circuit, and a buffer circuit.

30. A semiconductor device according to claim 28, wherein said second n-channel type thin film transistor is incorporated in a sampling circuit.

31. A semiconductor device according to claim 28, wherein said semiconductor device is an electroluminescence display device.

32. A semiconductor device according to claim 28, wherein said semiconductor device is one selected from the group consisting of a portable telephone, a video camera, a mobile computer, a goggle type display, a projector, a portable book, a digital camera, a car navigation system, and a personal computer.

33. A semiconductor device comprising a pixel portion and a driver circuit for driving said pixel portion formed over a same substrate, said pixel portion comprising:
   an n-channel type thin film transistor over said substrate, said n-channel type thin film transistor comprising:
      a semiconductor layer having at least a source region, a drain region, a channel forming region, and a lightly doped region comprising an n-type impurity between $1 \times 10^{16}$ and $5 \times 10^{18}$ atoms/cm$^3$; and
      a gate electrode adjacent to said channel forming region with a gate insulating film interposed therebetween,
      wherein said lightly doped region is disposed so as not to overlap said gate electrode, and
   said driver circuit comprising:
      a first and a second n-channel type thin film transistors over said substrate, each of said first and said second n-channel type thin film transistors comprising:
         a semiconductor layer having at least a source region, a drain region, a channel forming region, and a lightly doped region comprising an n-type impurity between $2 \times 10^{16}$ and $5 \times 10^{19}$ atoms/cm$^3$; and
         a gate electrode adjacent to said channel forming region with a gate insulating film interposed therebetween,
         wherein said lightly doped region of said first n-channel type thin film transistor disposed so as to entirely overlap said gate electrode of said first n-channel type thin film transistor,
            wherein said lightly doped region of said second n-channel type thin film transistor is disposed so as to partly overlap said gate electrode of said second n-channel type thin film transistor.

34. A semiconductor device according to claim 33, wherein said first n-channel type thin film transistor is incorporated in at least one selected from the group consisting of a shift register circuit, a level shifter circuit, and a buffer circuit.

35. A semiconductor device according to claim 33, wherein said second n-channel type thin film transistor is incorporated in a sampling circuit.

36. A semiconductor device according to claim 33, wherein said semiconductor device is an electroluminescence display device.

37. A semiconductor device according to claim 33, wherein said semiconductor device is one selected from the group consisting of a portable telephone, a video camera, a mobile computer, a goggle type display, a projector, a portable book, a digital camera, a car navigation system, and a personal computer.

38. A semiconductor device comprising:
   a pixel thin film transistor and a driver circuit for driving said pixel thin film transistor over a substrate, said pixel thin film transistor comprising:
   a semiconductor layer having at least a pair of impurity regions, a channel forming region, and a lightly doped region interposed between at least one of said pair of impurity regions and said channel forming region, said lightly doped region having a length of 3.5 $\mu$m or less along said channel forming region; and
   a gate electrode adjacent to said channel forming region with a gate insulating film interposed therebetween,
      wherein said lightly doped region does not overlap said gate electrode, and
   said driver circuit comprising:
      a first and a second n-channel type thin film transistors over said substrate, each of said first and said second n-channel type thin film transistors comprising:
      a semiconductor layer having at least a pair of impurity regions, a channel forming region, and a lightly doped region interposed between at least one of said of impurity regions and said channel forming region; and a gate electrode adjacent to said channel forming region with a gate insulating film interposed therebetween, wherein said lightly doped region of said first n-channel type thin film transistor entirely overlaps said gate electrode of said first n-channel type thin film transistor, and wherein said lightly doped region of said second n-channel type thin film transistor partially overlaps said gate electrode of said second n-channel type thin film transistor.

39. A semiconductor device according to claim 38 wherein said first n-channel type thin film transistor is incorporated in at least one selected from the group consisting of a shift register circuit, a level shifter circuit, and a buffer circuit.

40. A semiconductor device according to claim 38 wherein said second n-channel type thin transistor is incorporated in a sampling circuit.

41. A semiconductor device according to claim 38 wherein said semiconductor device is an electroluminescence display device.

42. A semiconductor device according to claim 38 wherein said semiconductor device is one selected from the group consisting of a portable telephone, a video camera, a mobile computer, a goggle type display, a projector, a portable book, a digital camera, a car navigation system, and a personal computer.

43. A semiconductor device comprising:

a pixel thin film transistor and a driver circuit for driving said pixel thin film transistor over a substrate, said pixel thin film transistor comprising:

a semiconductor layer having at least a pair of impurity regions, a channel forming region, and a lightly doped region interposed between at least one of said pair of impurity regions and said channel forming region, said lightly doped region having a length of 3.5 µm or less along said channel forming region; and a gate electrode adjacent to said channel forming region with a gate insulating film interposed therebetween, wherein said lightly doped region does not overlap said gate electrode, and said driver circuit comprising:

a first and a second n-channel type thin film transistors over said substrate, each of said first and said second n-channel type thin film transistors comprising:

a semiconductor layer having at least a pair of impurity regions, a channel forming region, and a lightly doped region interposed between at least one of said pair of impurity regions and said channel forming region, said lightly doped region containing an n-type impurity between $2\times10^{16}$ and $5\times10^{19}$ atoms/cm$^3$; and a gate electrode adjacent to said channel forming region with a gate insulating film interposed therebetween, wherein said lightly doped region of said first n-channel type thin film transistor entirely overlaps said gate electrode of said first n-channel type thin film transistor, and wherein said lightly doped region of said second n-channel type thin film transistor partially overlaps said gate electrode of said second n-channel type thin film transistor.

44. A semiconductor device according to claim 43, wherein said first n-channel type thin film transistor is incorporated in at least one selected from the group consisting of a shift register circuit, a level shifter circuit, and a buffer circuit.

45. A semiconductor device according to claim 43, wherein said second n-channel type thin film transistor is incorporated in a sampling circuit.

46. A semiconductor device according to claim 43, wherein said semiconductor device is an electroluminescence display device.

47. A semiconductor device according to claim 43, wherein said semiconductor device is one selected from the group consisting of portable telephone, a video camera, a mobile computer, a goggle type display, a projector, a portable book, a digital camera, a car navigation system, and a personal computer.

48. A semiconductor device comprising:

a pixel thin transistor and a driver circuit for driving said pixel thin film transistor over a substrate, said pixel thin film transistor comprising:

a semiconductor layer having at least a pair of impurity regions, a channel forming region, and a lightly doped region interposed between at least one of said pair of impurity regions and said channel forming region, said lightly doped region having a length of 3.5 µm or less along said channel forming region, and containing an n-type impurity between $1\times10^{16}$ and $5\times10^{18}$ atoms/cm$^3$; and a gate electrode adjacent to said channel forming region with a gate insulating film interposed therebetween, wherein said lightly doped region does not overlap said gate electrode, and said driver circuit comprising:

a first and a second n-channel type thin film transistors over said substrate, each of said first and second n-channel type thin film transistors comprising:

a semiconductor layer having at least a pair of impurity regions, a channel forming region, and a lightly doped region interposed between at least one of said pair of impurity regions and said channel forming region; and a gate electrode adjacent to said channel forming region with a gate insulating film interposed therebetween, wherein said lightly doped region of said first n-channel type thin film transistor entirely overlaps said gate electrode of said first n-channel type thin film transistor, and wherein said lightly doped region of said second n-channel type thin film transistor partially overlaps said gate electrode of said second n-channel type thin film transistor.

49. A semiconductor device according to claim 48, wherein said first n-channel type thin film transistor is incorporated in at least one selected from the group consisting of a shift register circuit, a level shifter circuit, and a buffer circuit.

50. A semiconductor device according to claim 48, wherein said second n-channel type thin film transistor is incorporated in a sampling circuit.

51. A semiconductor device according to claim 48, wherein said semiconductor device is an electroluminescence display device.

52. A semiconductor device according to claim 48, wherein said semiconductor device is one selected from the group consisting of a portable telephone, a video camera, a mobile computer, a goggle type display, a projector, a portable book, a digital camera, a car navigation system, and a personal computer.

* * * * *